(12) United States Patent
Nagasaka

(10) Patent No.: US 7,852,456 B2
(45) Date of Patent: Dec. 14, 2010

(54) EXPOSURE APPARATUS, EXPOSURE METHOD, AND METHOD FOR PRODUCING DEVICE

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 69 days.

(21) Appl. No.: 11/665,049

(22) PCT Filed: Oct. 12, 2005

(86) PCT No.: PCT/JP2005/018778

§ 371 (c)(1),
(2), (4) Date: Apr. 11, 2007

(87) PCT Pub. No.: WO2006/041083

PCT Pub. Date: Apr. 20, 2006

(65) Prior Publication Data

US 2008/0212043 A1    Sep. 4, 2008

(30) Foreign Application Priority Data

Oct. 13, 2004    (JP)    ............... 2004-298972

(51) Int. Cl.
*G03B 27/52*    (2006.01)
*G03B 27/42*    (2006.01)

(52) U.S. Cl. .................................. 355/30; 355/53
(58) Field of Classification Search .............. 355/30, 355/53, 67–71, 55; 378/34, 35; 250/548
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 4,509,852 A * | 4/1985 | Tabarelli et al. | ............ 355/30 |
| 4,666,273 A | 5/1987 | Shimizu et al. | |
| RE32,795 E | 12/1988 | Matsuura et al. | |
| 5,493,403 A | 2/1996 | Nishi | |
| 5,610,683 A * | 3/1997 | Takahashi | ............ 355/53 |
| 5,646,413 A | 7/1997 | Nishi | |
| 5,715,039 A | 2/1998 | Fukuda et al. | |
| 5,825,043 A | 10/1998 | Suwa | |

(Continued)

FOREIGN PATENT DOCUMENTS

CN    1606128 A    4/2005

(Continued)

OTHER PUBLICATIONS

Nov. 26, 2009 European Search Report in Application No. 05793205.5.

(Continued)

*Primary Examiner*—Hung Henry Nguyen
(74) *Attorney, Agent, or Firm*—Oliff & Berridge, PLC

(57) ABSTRACT

An exposure apparatus fills an optical path space of an exposure light beam with a liquid, and exposes a substrate by irradiating the substrate with the exposure light beam via a projection optical system and the liquid. A first optical element of the projection optical system is provided with a removing device for removing foreign matters in a space inside of the concave surface portion. Immersion exposure is performed by permitting the exposure light beam to excellently reach an image plane via the projection optical system and the liquid.

29 Claims, 11 Drawing Sheets

U.S. PATENT DOCUMENTS

| | | | |
|---|---|---|---|
| 5,969,441 | A | 10/1999 | Loopstra et al. |
| 6,195,154 | B1 | 2/2001 | Imai |
| 6,208,407 | B1 | 3/2001 | Loopstra |
| 6,235,438 | B1 | 5/2001 | Suzuki et al. |
| 6,341,007 | B1 | 1/2002 | Nishi et al. |
| 7,088,422 | B2 * | 8/2006 | Hakey et al. .................. 355/30 |
| 2001/0035945 | A1 | 11/2001 | Ozawa |
| 2002/0041377 | A1 | 4/2002 | Hagiwara et al. |
| 2002/0061469 | A1 | 5/2002 | Tanaka |
| 2004/0125351 | A1 | 7/2004 | Krautschik |
| 2004/0165159 | A1 | 8/2004 | Lof et al. |
| 2004/0263809 | A1 | 12/2004 | Nakano |
| 2005/0074704 | A1 | 4/2005 | Endo et al. |
| 2005/0219489 | A1 | 10/2005 | Nei et al. |
| 2006/0197927 | A1 | 9/2006 | Mulkens et al. |
| 2007/0009841 | A1 | 1/2007 | Endo et al. |

FOREIGN PATENT DOCUMENTS

| | | |
|---|---|---|
| DE | 221 563 A1 | 4/1985 |
| DE | 224 448 A1 | 7/1985 |
| EP | 0 605 103 A1 | 7/1994 |
| EP | 1 420 298 A2 | 5/2004 |
| EP | 1 571 697 A1 | 9/2005 |
| JP | A-57-117238 | 7/1982 |
| JP | A 58-202448 | 11/1983 |
| JP | A 59-19912 | 2/1984 |
| JP | A-60-078454 | 5/1985 |
| JP | A 62-65326 | 3/1987 |
| JP | A 63-157419 | 6/1988 |
| JP | A-04-065603 | 3/1992 |
| JP | A 4-305915 | 10/1992 |
| JP | A 4-305917 | 10/1992 |
| JP | A 5-62877 | 3/1993 |
| JP | A 6-124873 | 5/1994 |
| JP | A-07-176468 | 7/1995 |
| JP | A 7-220990 | 8/1995 |
| JP | A-08-037149 | 2/1996 |
| JP | A 8-316125 | 11/1996 |
| JP | A 10-303114 | 11/1998 |
| JP | A 10-340846 | 12/1998 |
| JP | A-11-016816 | 1/1999 |
| JP | A-11-135400 | 5/1999 |
| JP | A 11-176727 | 7/1999 |
| JP | A-11-195602 | 7/1999 |
| JP | A-11-260686 | 9/1999 |
| JP | A 2000-58436 | 2/2000 |
| JP | A-2001-267239 | 9/2001 |
| JP | A-2002-014005 | 1/2002 |
| JP | A 2004-207710 | 7/2004 |
| WO | WO 99/49504 | 9/1999 |
| WO | WO 2004/019128 A2 | 3/2004 |
| WO | WO 2004/029559 A1 | 4/2004 |
| WO | WO 2004/053955 A1 | 6/2004 |
| WO | WO 2004/055803 A1 | 7/2004 |
| WO | WO 2004/057590 A1 | 7/2004 |

OTHER PUBLICATIONS

Simon G. Kaplan et al., "Characterization of Refractive Properties of Fluids for Immersion Photolithography," Physics Laboratory National Institute of Standards and Technology, International Symposium on Immersion and 157 nm Lithography, Gaithersburg, Maryland, Aug. 3, 2004.

Office Action issued in European Patent Application No. 05793205.5 on Mar. 17, 2010.

Office Action issued in U.S. Appl. No. 11/665,073; mailed Apr. 2, 2010.

Office Action issued in Chinese Patent Application No. 200910008214.2; mailed Mar. 1, 2010; with partial English-language translation.

* cited by examiner

EXPOSURE APPARATUS, EXPOSURE METHOD, AND METHOD FOR PRODUCING DEVICE

TECHNICAL FIELD

The present invention relates to an exposure apparatus, an exposure method, and a method for producing a device, wherein a substrate is exposed through a liquid.

BACKGROUND ART

An exposure apparatus, which performs the projection exposure onto a photosensitive substrate with a pattern formed on a mask, is used in the photolithography step as one of the steps of producing microdevices such as semiconductor devices, liquid crystal display devices, and the like. The exposure apparatus includes a mask stage for supporting the mask and a substrate stage for supporting the substrate. The pattern of the mask is subjected to the projection exposure onto the substrate via a projection optical system while successively moving the mask stage and the substrate stage. In the microdevice production, it is required to realize a fine and minute pattern to be formed on the substrate in order to achieve a high density of the device. In order to respond to this requirement, it is demanded to realize a higher resolution of the exposure apparatus. A liquid immersion exposure apparatus, in which a liquid immersion area is formed by filling the space between the projection optical system and the substrate with a liquid to perform the exposure process through the liquid of the liquid immersion area, has been contrived as one of means to realize the high resolution, as disclosed in the patent literature 1.

Patent Literature 1: the International Publication No. 99/49504.

DISCLOSURE OF THE INVENTION

Task to be Solved by the Invention

In the liquid immersion exposure apparatus, the higher the refractive index of the liquid for filling the optical path space for the exposure light beam therewith is, the more improved the resolution and the depth of focus are. Accordingly, it is demanded to realize a liquid immersion exposure apparatus based on the use of the liquid having the high refractive index as described above.

The present invention has been made taking the foregoing circumstances into consideration. A first object of the present invention is to provide an exposure apparatus, an exposure method, and a method for producing a device based on the use of the exposure apparatus and the exposure method, wherein it is possible to realize the liquid immersion exposure by a liquid having a high refractive index. A second object of the present invention is to provide an exposure apparatus, an exposure method, and a method for producing a device based on the use of the exposure apparatus and the exposure method, wherein an exposure light beam is successfully allowed to arrive at an image plane through a liquid.

Solution for the Task

In order to achieve the objects as described above, the present invention adopts the following constructions corresponding to FIGS. 1 to 12 as illustrated in embodiments. However, parenthesized symbols affixed to respective elements merely exemplify the elements by way of example, with which it is not intended to limit the respective elements.

According to a first aspect of the present invention, there is provided an exposure apparatus (EX) which exposes a substrate (P) by radiating an exposure light beam (EL) onto the substrate (P) through a liquid (LQ); the exposure apparatus comprising a projection optical system (PL) which includes a plurality of optical elements, at least one (LS1) of the plurality of optical elements having a concave surface portion (2) making contact with the liquid; and a removing device (40) which removes a foreign matter in a space inside of the concave surface portion (2).

According to the first aspect of the present invention, at least one optical element for constructing the projection optical system has the concave surface portion which makes contact with the liquid. Therefore, the angle of incidence of the exposure light beam can be reduced at the interface between the liquid and the optical element, and the exposure light beam is successfully allowed to arrive at the object (substrate or substrate stage) arranged on the image plane of the projection optical system or in the vicinity thereof. Even when any foreign matter is present in the space inside of the concave surface portion of the optical element which makes contact with the liquid, the foreign matter is removed by the removing device. Therefore, it is possible to allow the exposure light beam to satisfactorily arrive at the image plane of the projection optical system or the position disposed in the vicinity thereof.

According to a second aspect of the present invention, there is provided an exposure apparatus (EX) which exposes a substrate (P) by radiating an exposure light beam (EL) onto the substrate (P) through a liquid (LQ); the exposure apparatus comprising a projection optical system (PL) which includes a plurality of optical elements (LS1 to LS5) and which has a first optical element (LS1) included in the plurality of optical elements and disposed closest to an image plane of the projection optical system, the first optical element (LS1) having a concave surface portion (2) which makes contact with the liquid (LQ); wherein a refractive index of the liquid with respect to the exposure light beam is higher than a refractive index of the first optical element.

According to the second aspect of the present invention, the liquid is used, which has the refractive index higher than the refractive index of the first optical element disposed closest to the image plane of the projection optical system with respect to the exposure light beam. Accordingly, it is possible to greatly improve the resolution and the depth of focus. The first optical element has the concave surface portion which makes contact with the liquid. Therefore, it is possible to allow the exposure light beam to satisfactorily arrive at the image plane of the projection optical system or the position disposed in the vicinity thereof.

According to a third aspect of the present invention, there is provided a method for producing a device, comprising using the exposure apparatus (EX) as defined in any one of the aspects described above. According to the third aspect of the present invention, it is possible to provide the device having the desired performance.

According to a fourth aspect of the present invention, there is provided an exposure method for exposing a substrate by radiating an exposure light beam onto the substrate (P) via a liquid (LQ) and an optical element (LS1) having a concave surface portion (2) which makes contact with the liquid (LQ); the exposure method including removing a foreign matter from the liquid (LQ) in the concave surface portion (2) of the optical element; and exposing the substrate (P) by radiating the exposure light beam onto the substrate via the optical element (LS1) and the liquid (LQ). According to this exposure method, the surface of the optical element which makes contact with the liquid is the concave surface. Therefore, the light beam, which is inclined with respect to the optical axis of the optical element, successfully has the reduced angle of incidence (angle of incidence toward the liquid) at the interface between the liquid and the optical element. Therefore, even when the refractive index of the liquid is higher than the refractive index of the optical element, it is possible to allow the outermost beam of the light flux (convergent light flux) to come into the liquid as well.

According to a fifth aspect of the present invention, there is provided an exposure method for exposing a substrate (P) by radiating an exposure light beam (EL) onto the substrate (P) via a liquid (LQ) and an optical element (LS1) having a concave surface portion to make contact with the liquid; the exposure method including supplying the liquid (LQ) to a space between the substrate (P) and the concave surface portion (2) of the optical element (LS1), the liquid (LQ) having a refractive index higher than a refractive index of the optical element; and exposing the substrate by radiating the exposure light beam onto the substrate (P) via the optical element (LS1) and the liquid. According to this exposure method, the exposure is performed through the liquid having the refractive index higher than the refractive index of the optical element (LS1). Therefore, it is possible to increase the numerical aperture NA for the optical element and the light radiation system (projection optical system) including the optical element, and it is possible to improve the resolution and the depth of focus. The reflection of the exposure light beam at the interface between the liquid and the optical element, which tends to occur as the numerical aperture NA is increased, is suppressed by the concave surface portion provided at the portion of the optical element which makes contact with the liquid.

According to a sixth aspect of the present invention, there is provided a method for producing a device; including exposing a substrate by the exposure method as defined in the fourth or fifth aspect; developing the exposed substrate; and processing the developed substrate. According to this production method, it is possible to provide the high density device having the desired performance.

EFFECT OF THE INVENTION

According to the present invention, it is possible to allow the exposure light beam to satisfactorily arrive at the image plane or the position in the vicinity thereof. It is possible to perform the accurate exposure process, and it is possible to produce the device having the desired performance.

PARTS LIST

1: liquid immersion mechanism, 2: concave surface portion, 10: liquid supply mechanism, 18: supply port, 19: mixing unit, 20: liquid recovery mechanism, 28: recovery port, 40: removing unit, 43: suction port, 44: driving mechanism, 50: detection unit, 70: nozzle member, CONT: control unit, EL: exposure light beam, EX: exposure apparatus, LQ: liquid, LS1: first optical element, P: substrate, PL: projection optical system, PST (PST1): substrate stage, PST2: measuring stage, PSTD: substrate stage-driving unit, T1: lower surface.

BEST MODE FOR CARRYING OUT THE INVENTION

Embodiments of the present invention will be explained below with reference to the drawings. However, the present invention is not limited thereto.

First Embodiment

Figure 1:
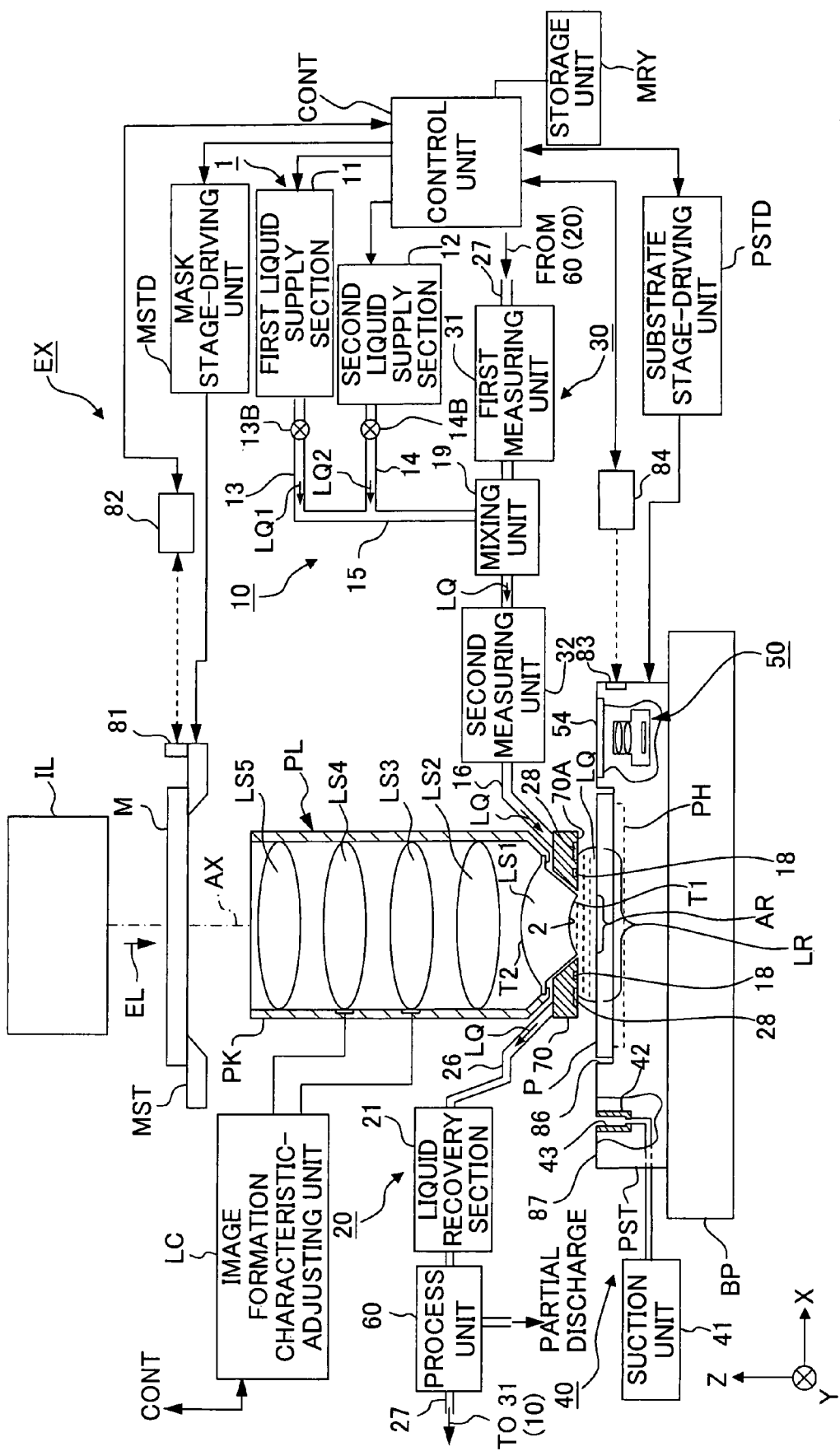
FIG. 1 shows a schematic arrangement illustrating an exposure apparatus according to a first embodiment.

FIG. 1 shows a schematic arrangement illustrating an exposure apparatus EX according to a first embodiment. With reference to FIG. 1, the exposure apparatus EX comprises a mask stage MST which is movable while holding a mask M, a substrate stage PST which is movable while holding a substrate P, an illumination optical system IL which illuminates, with an exposure light beam EL, the mask M held by the mask stage MST, a projection optical system PL which projects an image of a pattern of the mask M illuminated with the exposure light beam EL onto the substrate P held by the substrate stage PST, and a control unit CONT which integrally controls the operation of the entire exposure apparatus EX. A storage unit MRY, which stores various pieces of information in relation to the exposure process, is connected to the control unit CONT.

The exposure apparatus EX of this embodiment is a liquid immersion exposure apparatus to which the liquid immersion method is applied in order that the exposure wavelength is substantially shortened to improve the resolution and to substantially widen the depth of focus. The exposure apparatus EX is provided with a liquid immersion mechanism 1 which forms a liquid immersion area LR of the liquid LQ on the substrate P. The liquid immersion mechanism 1 includes a nozzle member 70 which is provided in the vicinity of the image plane of the projection optical system PL and which has a supply port 18 for supplying the liquid LQ and a recovery port 28 for recovering the liquid LQ, a liquid supply mechanism 10 which supplies the liquid LQ to the image plane side of the projection optical system PL via the supply port 18 provided for the nozzle member 70, and a liquid recovery mechanism 20 which recovers the liquid LQ on the image plane side of the projection optical system PL via the recovery port 28 provided for the nozzle member 70. The nozzle member 70 is formed in an annular form so that a first optical element LS1, which is included in a plurality of optical elements LS1 to LS5 for constructing the projection optical system PL and which is disposed closest to the image plane of the projection optical system PL, is surrounded over or above the substrate P (substrate stage PST).

The first optical element LS1 of the projection optical system PL, which is disposed closest to the image plane of the projection optical system PL, has a concave surface portion 2 which makes contact with the liquid LQ of the liquid immersion area LR. The concave surface portion 2 is provided on the lower surface T1 of the first optical element LS1 opposed to the substrate P. The exposure apparatus EX further includes a removing unit 40 which removes any foreign matter in the space inside of the concave surface portion 2 of the first optical element LS1. The removing unit 40 includes a suction member 42 which has a suction port 43 for sucking the foreign matter and which is provided on the substrate stage PST that is movable on the image plane side of the projection optical system PL. The exposure apparatus EX further includes a detection unit 50 which detects whether or not the foreign matter is present in the space inside of the concave surface portion 2. The detection unit 50 includes an image pickup device such as CCD, which is provided on the substrate stage PST.

The exposure apparatus EX forms the liquid immersion area LR locally on a part of the substrate P including a projection area AR of the projection optical system PL by the liquid LQ supplied from the liquid supply mechanism 10 at least during the period in which the pattern image of the mask M is transferred onto the substrate P, the liquid immersion area LR being larger than the projection area AR and smaller than the substrate P. Specifically, the exposure apparatus EX adopts the local liquid immersion system, wherein the optical path space, which is disposed between the first optical element LS1 arranged closest to the image plane of the projection optical system PL and the surface of the substrate P arranged on the image plane side of the projection optical system PL, is filled with the liquid LQ. The liquid immersion area of the liquid LQ is formed on a part of the substrate P, and the exposure light beam EL, which is allowed to pass through the mask M, is radiated onto the substrate P via the liquid LQ and the projection optical system PL. Accordingly, the substrate P is subjected to the projection exposure with the pattern of the mask M. The control unit CONT locally forms the liquid immersion area LR of the liquid LQ on the substrate P such that a predetermined amount of the liquid LQ is supplied onto the substrate P by the liquid supply mechanism 10, and a predetermined amount of the liquid LQ on the substrate P is recovered by the liquid recovery mechanism 20.

The embodiment of the present invention will be explained as exemplified by a case of the use of the scanning type exposure apparatus (so-called scanning stepper) as the exposure apparatus EX in which the substrate P is exposed with the pattern formed on the mask M while synchronously moving the mask M and the substrate P in mutually different directions (opposite directions) in the scanning directions. In the following explanation, the X axis direction resides in the synchronous movement direction (scanning direction) for the mask M and the substrate P in the horizontal plane, the Y axis direction (non-scanning direction) resides in the direction which is perpendicular to the X axis direction in the horizontal plane, and the Z axis direction resides in the direction which is perpendicular to the X axis direction and the Y axis direction and which is coincident with the optical axis AX of the projection optical system PL. The directions of rotation (inclination) about the X axis, the Y axis, and the Z axis are designated as θX, θY, and θZ directions respectively. The term "substrate" referred to herein includes those obtained by coating a semiconductor wafer with a resist (photosensitive material), and the term "mask" includes a reticle formed with a device pattern to be subjected to the reduction projection onto the substrate.

The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a field diaphragm which sets the illumination area on the mask M illuminated with the exposure light beam EL. The predetermined illumination area on the mask M is illuminated with the exposure light beam EL having a uniform illuminance distribution by the illumination optical system IL. Those usable as the exposure light beam EL radiated from the illumination optical system IL include, for example, far ultraviolet light beams (DUV light beams) such as emission lines (g-ray, h-ray, i-ray) radiated, for example, from a mercury lamp, the KrF excimer laser beam (wavelength: 248 nm), and the like, and vacuum ultraviolet light beams (VUV light beams) such as the ArF excimer laser beam (wavelength: 193 nm), the $F_2$ laser beam (wavelength: 157 nm), and the like. In this embodiment, the ArF excimer laser beam is used.

The mask stage MST is movable while holding the mask M. The mask stage MST holds the mask M by means of the vacuum attraction (or the electrostatic attraction). The mask stage MST is two-dimensionally movable in the plane perpendicular to the optical axis AX of the projection optical system PL, i.e., in the XY plane, and it is finely rotatable in the θZ direction in a state in which the mask M is held, in accordance with the driving of a mask stage-driving unit MSTD including a linear motor controlled by the control unit CONT. A movement mirror 81, which is movable together with the mask stage MST, is provided on the mask stage MST. A laser interferometer 82 is provided at a position opposed to the movement mirror 81. The position in the two-dimensional direction and the angle of rotation in the θZ direction (including the angles of rotation in the θX and θY directions in some situations) of the mask M on the mask stage MST are measured in real-time by the laser interferometer 82. The result of the measurement of the laser interferometer 82 is outputted to the control unit CONT. The control unit CONT drives the mask stage-driving unit MSTD on the basis of the result of the measurement obtained by the laser interferometer 82 to thereby control the position of the mask M held on the mask stage MST.

The projection optical system PL projects the pattern of the mask M onto the substrate P at a predetermined projection magnification β to perform the exposure. The projection optical system PL comprises a plurality of optical elements LS1 to LS5. The optical elements LS1 to LS5 are supported by a barrel PK. In this embodiment, the projection optical system PL is the reduction system having the projection magnification β which is, for example, ¼, ⅕, or ⅛. The projection optical system PL may be any one of the 1× magnification system and the magnifying system. The projection optical system PL is the dioptric system including no catoptric element. However, the projection optical system PL may be the catadioptric system including dioptric and catoptric elements.

The projection optical system PL is provided with an image formation characteristic-adjusting unit LC as disclosed, for example, in Japanese Patent Application Laid-open Nos. 60-78454 and 11-195602. The image formation characteristic-adjusting unit LC is adjustable of the image formation characteristic such as the image plane position of the projection optical system PL by driving a specified optical element of the plurality of optical elements LS1 to LS5 included in the projection optical system PL and/or adjusting the pressure in the barrel PK.

The substrate stage PST has a substrate holder PH which holds the substrate P. The substrate holder PH is movable on the image plane side of the projection optical system PL. The substrate holder PH holds the substrate P, for example, by the vacuum attraction. A recess 86 is provided on the substrate stage PST. The substrate holder PH for holding the substrate P is arranged in the recess 86. The upper surface 87 of the substrate stage PST other than the recess 86 is a flat surface (flat section) which has approximately the same height as that of (flush with) the surface of the substrate P held by the substrate holder PH.

The substrate stage PST is two-dimensionally movable in the XY plane on the base member BP, and it is finely rotatable in the θZ direction in a state in which the substrate P is held by the aid of the substrate holder PH, in accordance with the driving of the substrate stage-driving unit PSTD including a linear motor or the like controlled by the control unit CONT. Further, the substrate stage PST is also movable in the Z axis direction, the θX direction, and the θY direction. Therefore, the surface of the substrate P supported by the substrate stage PST is movable in the directions of six degrees of freedom in the X axis, Y axis, Z axis, θX, θY, and θZ directions. A movement mirror 83, which is movable together with the substrate stage PST, is fixed to the side surface of the substrate stage PST. A laser interferometer 84 is provided at a position opposed to the movement mirror 83. The position in the two-dimensional direction and the angle of rotation of the substrate P on the substrate stage PST are measured in real time by the laser interferometer 84. The exposure apparatus EX is provided with a focus/leveling-detecting system (not shown) based on the oblique incidence system which detects the surface position information about the surface of the substrate P held by the substrate stage PST as disclosed, for example, in Japanese Patent Application Laid-open No. 8-37149. The focus/leveling-detecting system detects the surface position information about the surface of the substrate P (position information in the Z axis direction, and the information about the inclination in the θX and θY directions of the substrate P). A system based on an electrostatic capacity type sensor may be adopted for the focus/leveling-detecting system. The result of the measurement performed by the laser interferometer 84 is outputted to the control unit CONT. The result of the detection performed by the focus/leveling-detecting system is also outputted to the control unit CONT. The control unit CONT drives the substrate stage-driving unit PSTD on the basis of the detection result of the focus/leveling-detecting system to adjust and match the surface of the substrate P with respect to the image plane of the projection optical system PL by controlling the focus position (Z position) and the angle of inclination (θX, θY) of the substrate P. Further, the position is controlled in the X axis direction, the Y axis direction, and the θZ direction of the substrate P on the basis of the measurement result of the laser interferometer 84.

Next, an explanation will be made about the liquid LQ for filling the optical path space for the exposure light beam EL therewith. In the following explanation, the refractive index of the liquid LQ and the refractive index of the first optical element LS1 with respect to the exposure light beam EL (ArF laser beam, wavelength: 193 nm) will be simply referred to as "refractive index". In this embodiment, the liquid supply mechanism 10 supplies the liquid LQ having the refractive index higher than the refractive index of the first optical element LS1 which is disposed closest to the image plane of the projection optical system PL and which is included in the plurality of optical elements LS1 to LS5 for constructing the projection optical system PL. The optical path space, which is disposed between the first optical element LS1 and the substrate P (or the substrate stage PST) arranged on the image plane side of the projection optical system PL, is filled with the liquid LQ having the high refractive index. In this embodiment, the first optical element LS1 is formed of silica glass. The refractive index of the liquid LQ is higher than the refractive index of silica glass. In this case, the refractive index of silica glass is about 1.5, and the refractive index of the liquid LQ supplied from the liquid supply mechanism 10 is about 1.6. The first optical element LS1 may be formed of calcium fluoride.

The ArF excimer laser beam as the exposure light beam EL is transmissive through silica glass which is the material for forming the first optical element LS1. Silica glass is the material having the large refractive index. Therefore, for example, it is possible to decrease the size (diameter) of the first optical element LS1. It is possible to realize compact sizes of the entire projection optical system PL and the entire exposure apparatus EX. For example, the optical elements LS2 to LS5 may be formed of calcium fluoride, and the optical element LS1 may be formed of silica glass. Alternatively, the optical elements LS2 to LS5 may be formed of silica glass, and the optical element LS1 may be formed of calcium fluoride. Further alternatively, all of the optical elements LS1 to LS5 may be formed of silica glass (or calcium fluoride).

Figure 2:
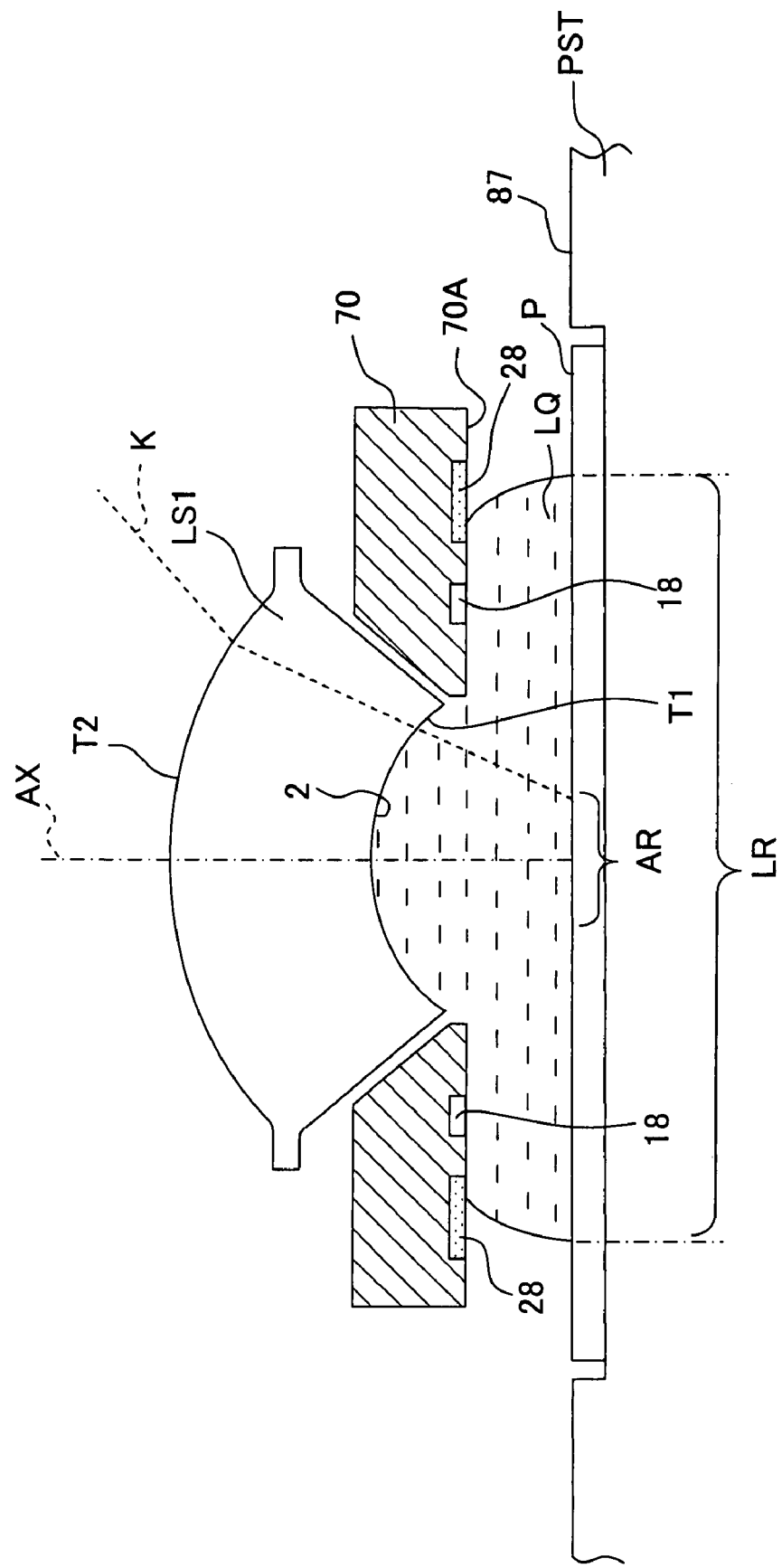
FIG. 2 shows a magnified view illustrating those disposed in the vicinity of a first optical element.

FIG. 2 shows a magnified sectional view illustrating those disposed in the vicinity of the first optical element LS1 arranged closest to the image plane of the projection optical system PL. With reference to FIG. 2, the concave surface portion 2 is formed at the lower surface T1 of the first optical element LS1 opposed to the substrate P. The supply port 18 is provided on the lower surface 70A of the nozzle member 70 opposed to the substrate P so that the supply port 18 surrounds the projection area AR of the projection optical system PL. The recovery port 28 is provided outside the supply port 18 with respect to the projection area AR on the lower surface 70A of the nozzle member 70. The recovery port 28 is formed to have an annular slit-shaped form on the lower surface 70A of the nozzle member 70. The space among the lower surface T1 of the first optical element LS1, the lower surface 70A of the nozzle member 70, and the substrate P is filled with the liquid LQ of the liquid immersion area LR.

The optical path space, which is disposed on the side of the upper surface T2 of the first optical element LS1, is filled with the gas (nitrogen). The optical path space, which is disposed on the side of the lower surface T1 of the first optical element LS1, is filled with the liquid LQ. The upper surface T2 of the first optical element LS1 has a shape of convex curved surface to expand toward the object plane of the projection optical system PL (toward the mask). With this shape, all beams, which form the image on the surface of the substrate P (image plane), are allowed to come thereinto.

The lower surface T1 of the first optical element LS1 has the concave surface portion 2 which is recessed to make separation from the substrate P. The concave surface portion 2 has a curved shape. In the same manner as the shape of the upper surface T2, the lower surface T1 has such a shape that all beams, which form the image on the surface of the substrate P, are allowed to come thereinto.

With reference to FIG. 2, the lower surface T1 and the upper surface T2 of the first optical element LS1 are depicted to have spherical shapes having the same center of curvature.

However, the respective curvatures and the curved shapes can be appropriately determined so that the projection optical system PL successfully obtains the desired performance. It is also allowable to provide any non-spherical shape. When the lower surface T1 and the upper surface T2 have the curved shapes including the spherical shapes, the curvatures of the lower surface T1 and the upper surface T2 can be appropriately determined so that all of the beams, which form the image on the surface of the substrate P, are allowed to come into the surfaces, and the angles of incidence of the light beams allowed to come into the lower surface T1 and the upper surface T2 are reduced in accordance with the following principle.

The numerical aperture NA of the projection optical system PL on the image plane side is represented by the following expression.

$$NA = n \cdot \sin \theta \quad (1)$$

In this expression, n represents the refractive index of the liquid LQ, and $\theta$ represents the convergence half angle. The resolution R and the depth of focus $\delta$ are represented by the following expressions respectively.

$$R = k_1 \cdot \lambda / NA \quad (2)$$

$$\delta = \pm k_2 \cdot \lambda / NA^2 \quad (3)$$

In these expressions, $\lambda$ represents the exposure wavelength, and $k_1$ and $k_2$ represent the process coefficients. As described above, when the numerical aperture NA is increased about n times by the liquid LQ having the high refractive index (n), it is possible to greatly improve the resolution and the depth of focus according to the expressions (2) and (3).

When it is intended to obtain the numerical aperture NA of the projection optical system PL which is not less than the refractive index of the first optical element LS1, if the lower surface T1 is a flat surface which is substantially perpendicular to the optical axis AX, then a part of the exposure light beam EL, which includes the outermost beam K of the exposure light beam EL, is totally reflected by the interface between the first optical element LS1 and the liquid LQ, and the part of the exposure light beam EL cannot arrive at the image plane of the projection optical system PL. For example, the following expression holds according to the Snell's law provided that $n_1$ represents the refractive index of the first optical element LS1, $n_2$ represents the refractive index of the liquid LQ, $\theta_1$ represents the angle of the outermost beam K of the exposure light beam EL allowed to come into the interface (lower surface T1) between the first optical element LS1 and the liquid LQ with respect to the optical axis AX, and $\theta_2$ represents the angle of the beam K allowed to outgo from the interface (allowed to come into the liquid LQ) with respect to the optical axis AX.

$$n_1 \sin \theta_1 = n_2 \sin \theta_2 \quad (4)$$

The numerical aperture of the projection optical system PL is represented by the following expression by the refractive index $n_2$ of the liquid LQ and the angle $\theta_2$ of the beam K allowed to come into the liquid LQ with respect to the optical axis AX.

$$NA = n_2 \sin \theta_2 \quad (5)$$

According to the expressions (4) and (5), the following expression holds.

$$\sin \theta_1 = NA / n_1 \quad (6)$$

Therefore, as clarified from the expression (6) as well, if the interface (lower surface T1) between the first optical element LS1 and the liquid LQ is the flat surface substantially perpendicular to the optical axis AX, and the numerical aperture NA of the projection optical system PL is larger than the refractive index $n_1$ of the first optical element LS1, then the part of the light beam, which includes the outermost beam K of the exposure light beam EL, cannot come into the liquid LQ. On the contrary, the lower surface T1 of the first optical element LS1 of this embodiment has the concave surface portion 2. Therefore, it is possible to lower the angle of incidence of the light beam allowed to come into the interface (lower surface T1) between the first optical element LS1 and the liquid LQ, especially the beam inclined with respect to the optical axis AX of the projection optical system PL. Accordingly, even when the numerical aperture NA of the projection optical system PL is larger than the refractive index $n_1$ of the first optical element LS1, the outmost beam K of the exposure light beam EL can arrive at the image plane satisfactorily without being totally reflected by the interface.

Figure 3:
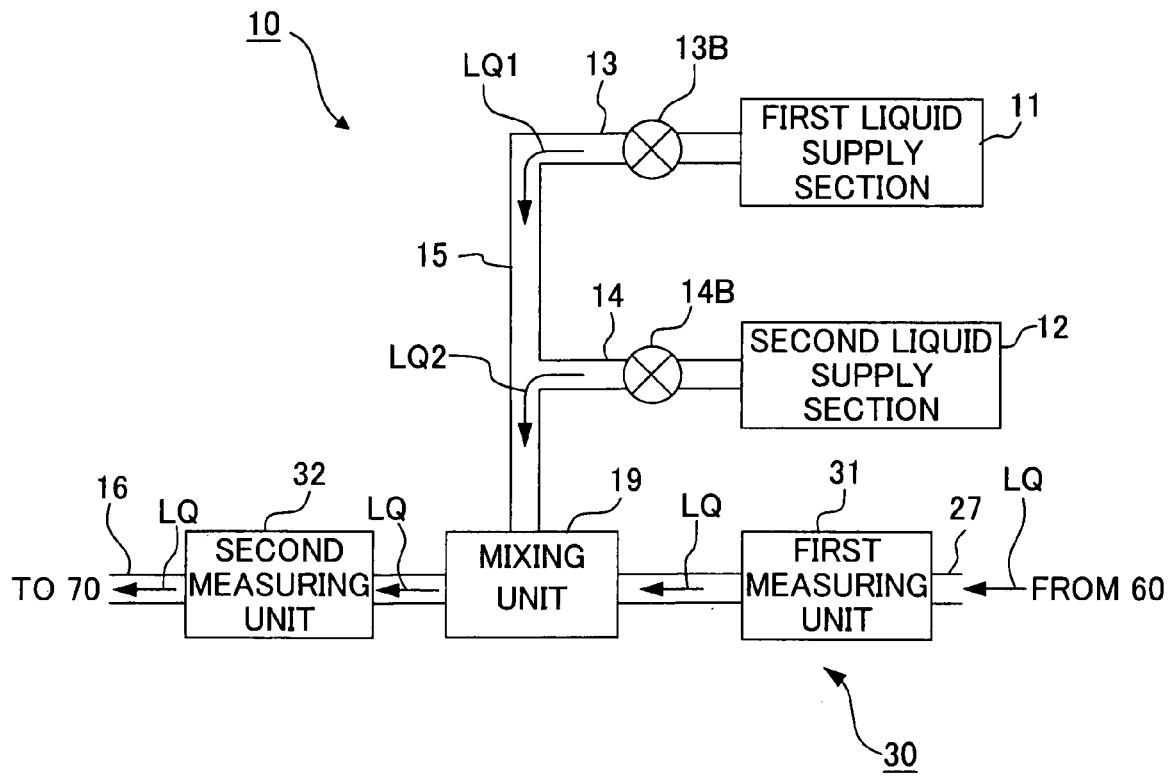
FIG. 3 shows an arrangement illustrating a liquid supply mechanism.

Next, an explanation will be made about the liquid supply mechanism 10 and the liquid recovery mechanism 20 of the liquid immersion mechanism 1. FIG. 3 shows parts of the liquid supply mechanism 10. As shown in FIGS. 1 and 3, the liquid supply mechanism 10 of this embodiment is provided with a first liquid supply section 11 which is capable of feeding a first liquid LQ1, a second liquid supply section 12 which is capable of feeding a second liquid LQ2, and a mixing unit 19 which mixes the first liquid LQ1 fed from the first liquid supply section 11 and the second liquid LQ2 fed from the second liquid supply section 12. The liquid LQ, which is prepared by the mixing unit 19, is supplied to the image plane side of the projection optical system PL. The first liquid LQ1 and the second liquid LQ2 are different from each other. The mixing unit 19 mixes the two types of the liquids LQ1, LQ2. As described above, the exposure apparatus of this embodiment is provided with the mixing unit which mixes the two types of the liquids LQ1, LQ2. Accordingly, it is possible to appropriately adjust the optical properties such as the transmittance and the refractive index of the liquid LQ for forming the liquid immersion area LR. In this embodiment, glycerol, which has a refractive index of about 1.61, is used as the first liquid LQ1, and isopropanol, which has a refractive index of about 1.50, is used as the second liquid LQ2. The amounts of the first liquid LQ1 and the second liquid LQ2 are adjusted so that the liquid LQ, which is obtained by mixing them, has a refractive index of about 1.60.

Each of the first and second liquid supply sections 11, 12 includes, for example, a tank for accommodating the first or second liquid LQ1, LQ2, a pressurizing pump, a temperature-adjusting unit for adjusting the temperature of the first or second liquid LQ1, LQ2 to be supplied, a filter unit for removing any foreign matter (including any bubble) from the first or second liquid LQ1, LQ2, and the like. It is not necessary that the exposure apparatus EX is provided with all of the tank, the pressurizing pump, the filter unit and the like of the liquid supply mechanism 10. These components may be replaced with the equipment of a factory or the like in which the exposure apparatus EX is installed. One end of a first supply tube 13 is connected to the first liquid supply section 11. The other end of the first supply tube 13 is connected to a collective tube 15. One end of a second supply tube 14 is connected to the second liquid supply section 12. The other end of the second supply tube 14 is connected to the collective tube 15. The first liquid LQ1, which is fed from the first liquid supply section 11, is allowed to flow through the first supply tube 13, and then the first liquid LQ1 is supplied to the mixing unit 19 via the collective tube 15. The second liquid LQ2, which is fed from the second liquid supply section 12, is allowed to flow through the second supply tube 14, and then the second liquid LQ2 is supplied to the mixing unit 19 via the collective tube 15.

Valves 13B, 14B are provided for the first and second supply tubes 13, 14 respectively. The operations of the valves 13B, 14B are controlled by the control unit CONT. The control unit CONT adjusts the valves 13B, 14B (opening degrees of the valves 13B, 14B), and thus the supply amounts per unit time of the first and second liquids LQ1, LQ2, which are supplied from the first and second liquid supply sections 11, 12 to the mixing unit 19 via the first and second supply tubes 13, 14 and the collective tube 15, are adjusted respectively.

The liquid LQ, which is returned from the liquid recovery mechanism 20, can be also supplied to the mixing unit 19. The liquid LQ, which is returned from the liquid recovery mechanism 20, is supplied to the mixing unit 19 via a return tube 27. The mixing unit 19 mixes the first and second liquids LQ1, LQ2 supplied from the first and second liquid supply sections 11, 12 via the first and second supply tubes 13, 14 and the collective tube 15 with the liquid LQ supplied from the liquid recovery mechanism 20 via the return tube 27. One end of a supply tube 16 is connected to the mixing unit 19, and the other end is connected to the nozzle member 70. A supply internal flow passage, which has one end connected to the supply port 18, is formed in the nozzle member 70. The other end of the supply tube 16 is connected to the other end of the supply internal flow passage. The liquid LQ, which is prepared or produced by the mixing unit 19, is supplied to the nozzle member 70 via the supply tube 16. The liquid LQ is allowed to flow through the supply internal flow passage of the nozzle member 70, and then the liquid LQ is supplied from the supply port 18 to the image plane side of the projection optical system PL.

With reference to FIG. 1, the liquid recovery mechanism 20 includes a liquid recovery section 21 which is capable of recovering the liquid LQ in order to recover the liquid LQ on the image plane side of the projection optical system PL, and a recovery tube 26 which has one end connected to the liquid recovery section 21. The other end of the recovery tube 26 is connected to the nozzle member 70. The liquid recovery section 21 is provided with, for example, a vacuum system (suction unit) such as a vacuum pump or the like, a gas/liquid separator for separating the recovered liquid LQ from the gas, and a tank for accommodating the recovered liquid LQ. It is not necessary that the exposure apparatus EX is provided with all of the vacuum system, the gas/liquid separator, the tank and the like of the liquid recovery mechanism 20. These components may be replaced with the equipment of a factory or the like in which the exposure apparatus EX is installed. A recovery internal flow passage, which has one end connected to the recovery port 28, is formed in the nozzle member 70. The other end of the recovery tube 26 is connected to the other end of the recovery internal flow passage of the nozzle member 70. When the vacuum system of the liquid recovery section 21 is driven, then the liquid LQ on the substrate P, which is arranged on the image plane side of the projection optical system PL, is allowed to flow into the recovery internal flow passage from the recovery port 28, and the liquid LQ is recovered by the liquid recovery section 21 via the recovery tube 26.

The liquid recovery mechanism 20 is provided with a process unit 60 which applies a predetermined treatment to the recovered liquid LQ. The liquid recovery mechanism 20 returns the liquid LQ after being processed with the process unit 60 to the mixing unit 19 of the liquid supply mechanism 10 via the return tube 27. The process unit 60 cleans the recovered liquid LQ, which includes, for example, a filter unit and a distillation unit. The liquid LQ, which is recovered by the liquid recovery mechanism 20, may possibly contain any impurity generated from the substrate P due to the contact with the substrate P coated with the resist. Accordingly, the liquid recovery mechanism 20 cleans a part of the recovered liquid LQ with the process unit 60, and then the cleaned liquid LQ is returned to the mixing unit 19 of the liquid supply mechanism 10. A part of the residual of the recovered liquid LQ is discharged (discarded) by the liquid recovery mechanism 20 to the outside of the exposure apparatus EX without returning the part of the residual of the recovered liquid LQ to the liquid supply mechanism 10.

The liquid supply mechanism 10 further includes a measuring unit 30 which measures the optical property of the liquid LQ to be supplied to the image plane side of the projection optical system PL. The measuring unit 30 includes a first measuring unit 31 which is provided at an intermediate position of the return tube 27 disposed between the mixing unit 19 and the process unit 60 of the liquid recovery mechanism 20, and a second measuring unit 32 which is provided at an intermediate position of the supply tube 16 disposed between the mixing unit 19 and the nozzle member 70. The first measuring unit 31 measures the optical property of the liquid LQ which is returned from the process unit 60 of the liquid recovery mechanism 20 before being supplied to the mixing unit 19. The second measuring unit 32 measures the optical property of the liquid LQ which is prepared by the mixing unit 19 before being supplied to the image plane side of the projection optical system PL via the nozzle member 70. The first measuring unit 31 and the second measuring unit 32 are constructed substantially equivalently, which can measure at least one of the refractive index of the liquid LQ and the transmittance of the liquid LQ.

The control unit CONT adjusts the first and second valves 13B, 14B provided for the first and second supply tubes 13, 14 on the basis of the measurement result of the first measuring unit 31 to adjust the supply amounts per unit time of the first and second liquids LQ1, LQ2 to be supplied from the first and second liquid supply sections 11, 12 to the mixing unit 19 respectively. In other words, the control unit CONT adjusts the mixing ratio of the first and second liquids LQ1, LQ2 supplied from the first and second liquid supply sections 11, 12 respectively and mixed in the mixing unit 19 on the basis of the measurement result of the first measuring unit 31. In this embodiment, the mixing ratio of the first liquid LQ1 and the second liquid LQ2 is adjusted so that the refractive index is approximately 1.60.

The first and second liquids LQ1, LQ2 are the liquids of the different types. Therefore, the optical properties (refractive index, light transmittance) may be highly possibly different from each other. Accordingly, in order to obtain the desired state of the optical property of the liquid LQ to be prepared by the mixing unit 19, specifically in order to maintain a predetermined value of at least one of the refractive index and the light transmittance of the liquid LQ prepared by the mixing unit 19, the control unit CONT adjusts the mixing ratio of the first and second liquids LQ1, LQ2 subjected to the mixing in the mixing unit 19 on the basis of the measurement result of the first measuring unit 31. The first measuring unit 31 measures the optical property of the liquid LQ returned from the liquid recovery mechanism 20. Therefore, the control unit CONT can maintain the desired state of the optical property of the liquid LQ prepared by the mixing unit 19 such that appropriate amounts of the first and second liquids LQ1, LQ2 are appropriately added to the returned liquid LQ from the first and second liquid supply sections 11, 12 on the basis of the measurement result of the first measuring unit 31. As described above, each of the first and second liquid supply sections 11, 12 is provided with the temperature-adjusting unit for maintaining the constant temperature of each of the first and second liquids LQ1, LQ2. Therefore, the control unit CONT avoids the fluctuation of the optical property of the liquid LQ which would be otherwise caused by the fluctuation of the temperature of the liquid LQ, by controlling the temperature-adjusting unit.

The relationship between the mixing ratio of the first and second liquids LQ1, LQ2 and the optical property of the liquid LQ prepared on the basis of the mixing ratio is previously determined, for example, by an experiment or simulation. The information about the relationship is previously stored in the storage unit MRY connected to the control unit CONT. The control unit CONT can adjust the first and second valves 13B, 14B on the basis of the information stored in the storage unit MRY and the measurement result obtained by the first measuring unit 31 to determine the mixing ratio of the first and second liquids LQ1, LQ2 in order to obtain the desired optical property of the liquid LQ.

The optical property of the liquid LQ prepared by the mixing unit 19 is measured by the second measuring unit 32. The control unit CONT adjusts, for example, the positional relationship between the surface of the substrate P and the position of the image plane formed via the projection optical system PL and the liquid LQ on the basis of the measurement result of the second measuring unit 32. Specifically, the control unit CONT uses the image formation characteristic-adjusting unit LC provided for the projection optical system PL on the basis of the measurement result of the second measuring unit 32 so that the specified optical element of the plurality of optical elements LS1 to LS5 for constructing the projection optical system PL is driven and/or the pressure in the barrel PK is adjusted to adjust the position of the image plane of the projection optical system PL thereby. Accordingly, even when, for example, the refractive index, which is included in the optical property of the liquid LQ prepared by the mixing unit 19, is slightly varied, and the image plane position via the projection optical system PL and the liquid LQ is varied, then the image formation characteristic is adjusted in response to the optical property (refractive index) of the liquid LQ, and thus the surface of the substrate P can be aligned with the position of the image plane formed via the projection optical system PL and the liquid LQ. The control unit CONT may be operated such that the surface position of the substrate P is adjusted by driving the substrate stage PST, the mask stage MST, which holds the mask M, is driven, and/or the temperature of the liquid LQ to be supplied is adjusted, in place of the adjustment of the projection optical system PL by the image formation characteristic-adjusting unit LC or in combination with the adjustment by the image formation characteristic-adjusting unit LC. In this case, the relationship between the optical property of the liquid LQ and the position of the image plane formed via the projection optical system PL and the liquid LQ is previously determined, for example, by an experiment or simulation, and the information about the relationship is previously stored in the storage unit MRY connected to the control unit CONT. The control unit CONT can use, for example, the image formation characteristic-adjusting unit LC on the basis of the information stored in the storage unit MRY and the measurement result of the second measuring unit 32 so that the surface of the substrate P is consistent or coincident with the position of the image plane formed via the projection optical system PL and the liquid LQ. When the light transmittance, which is included in the optical property of the liquid LQ, is varied, the control unit CONT adjusts, for example, the illumination optical system IL including the light source on the basis of the measurement result of the second measuring unit 32, and the exposure amount control parameter can be adjusted in the scanning exposure including, for example, the scanning velocity of the substrate P and the radiation amount (illuminance) of the exposure light beam EL.

Figure 4:
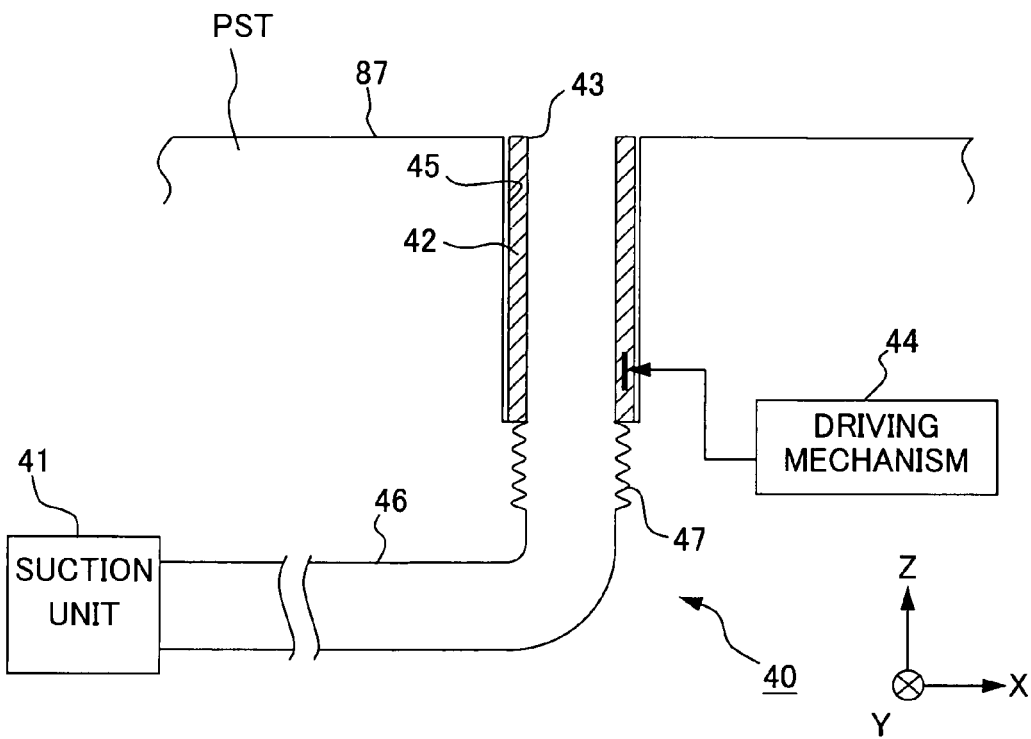
FIG. 4 shows a removing unit.

Next, the removing unit 40 will be explained. FIG. 4 shows the removing unit 40. As shown in FIGS. 1 and 4, the exposure apparatus EX is provided with the removing unit 40 which removes the foreign matter in the space inside of the concave surface portion 2 of the first optical element LS1. The removing unit 40 includes the suction member 42 which has the suction port 43 for sucking the foreign matter and which is provided for the substrate stage PST. As shown in FIG. 4, the removing unit 40 includes the suction member 42 which is arranged inside a hole 45 formed at a part of the upper surface 87 of the substrate stage PST, and a driving mechanism 44 which drives the suction member 42. The suction member 42 is a pipe-shaped member, and its upper end (one end) is the suction port 43. The suction port 43 is provided on the upper surface 87 of the substrate stage PST. The suction port 43 is arranged outside the exposure light beam EL during the exposure for the substrate P. The suction member 42 is movable in the Z axis direction in accordance with the driving force of the driving mechanism 44. The suction port 43 appears and disappears with respect to the upper surface 87 of the substrate stage PST. In this embodiment, when the suction member 42 is moved downwardly and arranged inside the hole 45, the suction port 43, which is provided at the upper end of the suction member 42, is substantially flush with the upper surface 87 of the substrate stage PST as shown in FIG. 4. The suction member 42 may be movable in the oblique direction in relation to the Z axis direction.

The suction port 43, which is provided on the upper surface 87 of the substrate stage PST, can be opposed to the concave surface portion 2 on the lower surface T1 of the first optical element LS1 of the projection optical system PL in accordance with the movement of the substrate stage PST. On the other hand, the lower end (the other end) of the suction member 42 is connected to the suction unit 41 via a flow passage-forming member 46. The suction unit 41 includes, for example, a vacuum system such as a vacuum pump, which is capable of sucking and recovering the liquid. A part of the flow passage-forming member 46 has an expandable/contractible portion 47 which is expandable/contractible in order not to inhibit the movement of the suction member 42.

Figure 12:
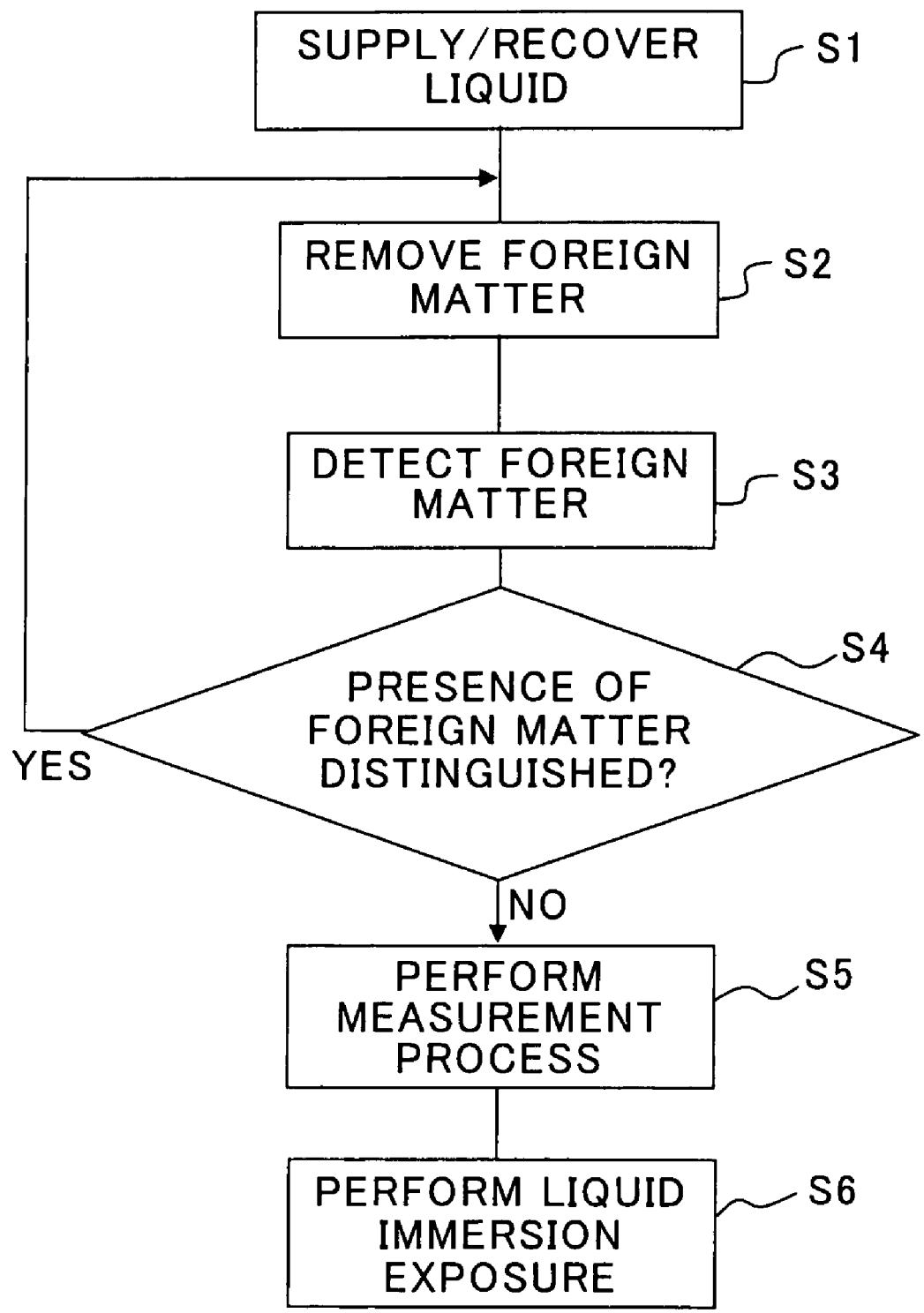
FIG. 12 shows a flow chart illustrating a procedure of an exposure method according to the present invention.

Next, an explanation will be made with reference to a flow chart shown in FIG. 12 about the operation for exposing the substrate P by the exposure apparatus EX constructed as described above. When the substrate P is subjected to the exposure, the control unit CONT starts the operation for forming the liquid immersion area LR of the liquid LQ by the liquid immersion mechanism 1. It is assumed that the substrate P to be subjected to the exposure process is already loaded on the substrate holder PH. When the operation for forming the liquid immersion area LR is started, the control unit CONT moves the substrate stage PST so that the concave surface portion 2 of the first optical element LS1 of the projection optical system PL is opposed to the recovery port 43 of the removing unit 40. The control unit CONT starts the supply operation of the liquid LQ by the liquid supply mechanism 10 of the liquid immersion mechanism 1 and the recovery operation of the liquid LQ by the liquid recovery mechanism 20 in the state in which the concave surface portion 2 of the first optical element LS1 of the projection optical system PL is opposed to the recovery port 43 of the removing unit 40 (S1).

Figure 5:
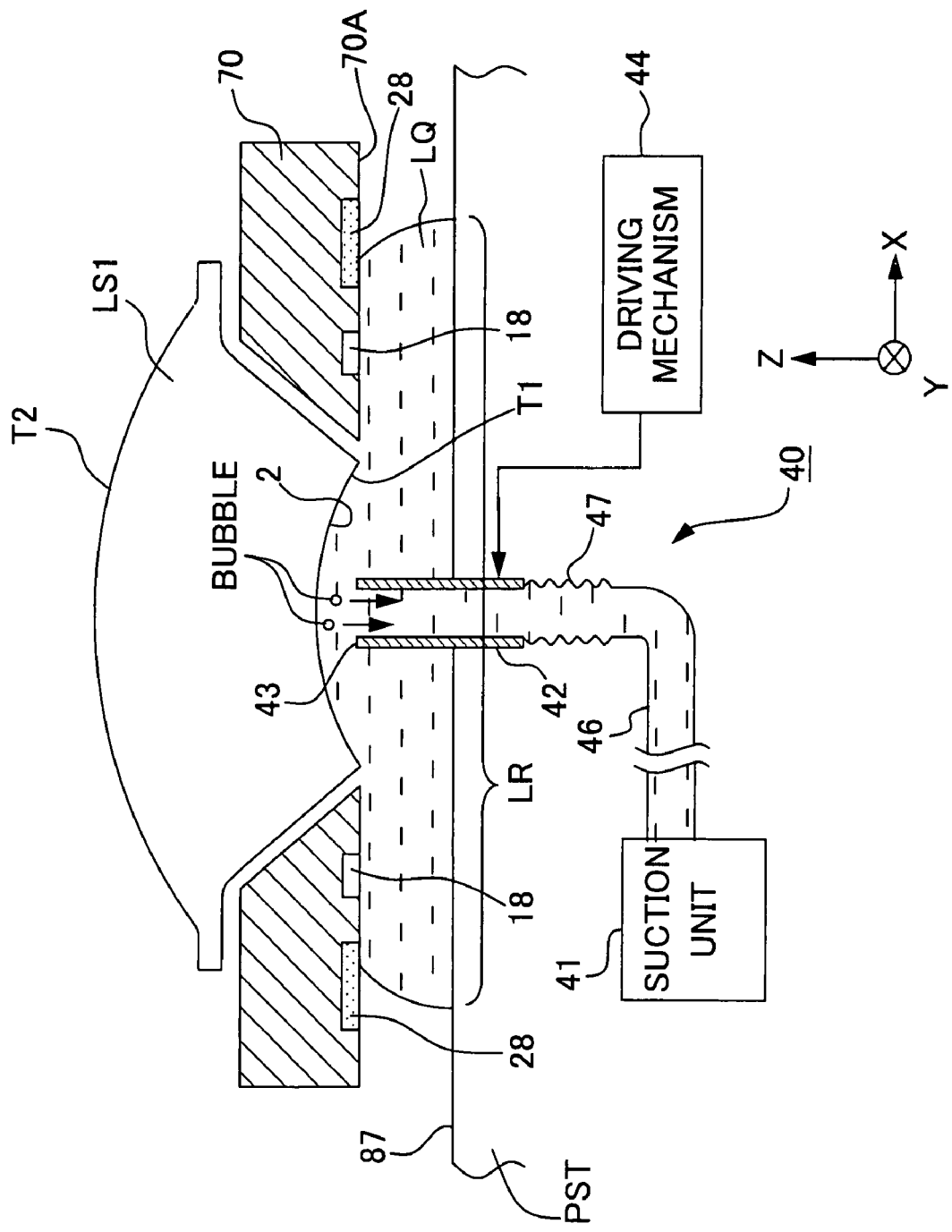
FIG. 5 shows a state in which the removing unit removes foreign matters.

FIG. 5 shows a state which is brought about immediately after starting the operation for forming the liquid immersion area LR. As shown in FIG. 5, when the operation for forming the liquid immersion area LR is started, there is such a possibility that any bubble (gas portion) may be formed in the liquid LQ. There is such a possibility that the bubble may be also formed after the elapse of a predetermined period of time after the start of the operation for forming the liquid immersion area LR depending on the state of the liquid immersion mechanism 1. In this embodiment, the first optical element LS1 has the concave surface portion 2. Therefore, there is such a high possibility that the bubble, which has a specific gravity smaller than that of the liquid LQ, stays at the highest position of the concave surface portion 2 or in the vicinity thereof. The control unit CONT drives the driving mechanism 44 of the removing unit 40 to move the suction member 42 upwardly so that the suction port 43, which is provided at the upper end of the suction member 42, is moved in the +Z direction, and the substrate stage PST, on which the suction member 42 is provided, is moved in the XY directions by the aid of the substrate stage-driving unit PSTD. Accordingly, the control unit CONT moves the suction port 43 relatively with respect to the concave surface portion 2 by the driving mechanism 44 and the substrate stage-driving unit PSTD to arrange the suction port 43 at the position optimum for the concave surface portion 2. Specifically, the control unit CONT arranges the suction port 43 of the removing unit 44 at the position in the vicinity of the position at which the bubble is arranged, i.e., at the highest position of the concave surface portion 2 or in the vicinity thereof, by the driving mechanism 44 and the substrate stage-driving unit PSTD. The control unit CONT drives the suction unit 41 in a state in which the suction port 43 is allowed to approach the concave surface portion 2 while leaving a predetermined distance (for example, about 1 mm) to suck and remove the bubble having the specific gravity smaller than that of the liquid LQ by the aid of the suction port 43, the bubble being contained in the liquid LQ in the space inside of the concave surface portion 2 (S2). In this procedure, the liquid supply operation by the liquid supply mechanism 10 of the liquid immersion mechanism 1 and the liquid recovery operation by the liquid recovery mechanism 20 are continued even when the operation to remove the bubble is performed by the removing unit 40. The suction amount and the relative distance between the suction port 43 and the concave surface portion 2, which are provided when the suction-port 43 sucks the bubble, are optimally adjusted depending on the physical properties such as the viscosity of the liquid LQ to be used. The suction operation (removal operation) may be executed while moving the suction port 43 in the Z direction (+Z direction and/or –Z direction). Alternatively, the suction operation (removal operation) may be executed while moving the suction port 43 in the direction perpendicular to the Z axis so that the suction port 43 does not collide with the concave surface portion 2.

The removing unit 40 can suck and remove any foreign matter having a specific gravity smaller than that of the liquid LQ in the liquid LQ in the space inside of the concave surface portion 2 without being limited to the bubble contained in the liquid LQ.

In this procedure, the operation for forming the liquid immersion area LR is started by the liquid immersion mechanism 1 in the state in which the suction port 43 is opposed to the concave surface portion 2. However, the following procedure is also available. That is, the liquid immersion area LR is formed in an area (including the surface of the substrate P) of the upper surface 87 of the substrate stage PST, the area being away from an area in which the suction port 43 is provided.

After that, the substrate stage PST is moved in the XY directions so that the suction port 43 is opposed to the concave surface portion 2 of the first optical element LS1. The foreign matter in the space inside of the concave surface portion 2 can be also removed smoothly such that the concave surface portion 2 is opposed to the suction port 43, and then the suction port 43 is allowed to approach the concave surface portion 2 to start the suction operation.

After the operation for removing the bubble contained in the liquid LQ is completed, the control unit CONT moves the suction member 42 of the removing unit 40 downwardly so that the suction member 42 is arranged inside the hole 45. The control unit CONT confirms, by the detection unit 50, whether or not the bubble (foreign matter) is removed from the liquid LQ in the space inside of the concave surface portion 2. That is, the control unit CONT moves the substrate stage PST in the XY directions so that the liquid immersion area LR, which is formed on the upper surface 87 of the substrate stage PST, is moved to the position over or above the detection unit 50. In this procedure, the liquid supply operation by the liquid supply mechanism 10 of the liquid immersion mechanism 1 and the liquid recovery operation by the liquid recovery mechanism 20 are also continued during the period in which the substrate stage PST is moved in the XY directions.

Figure 6:
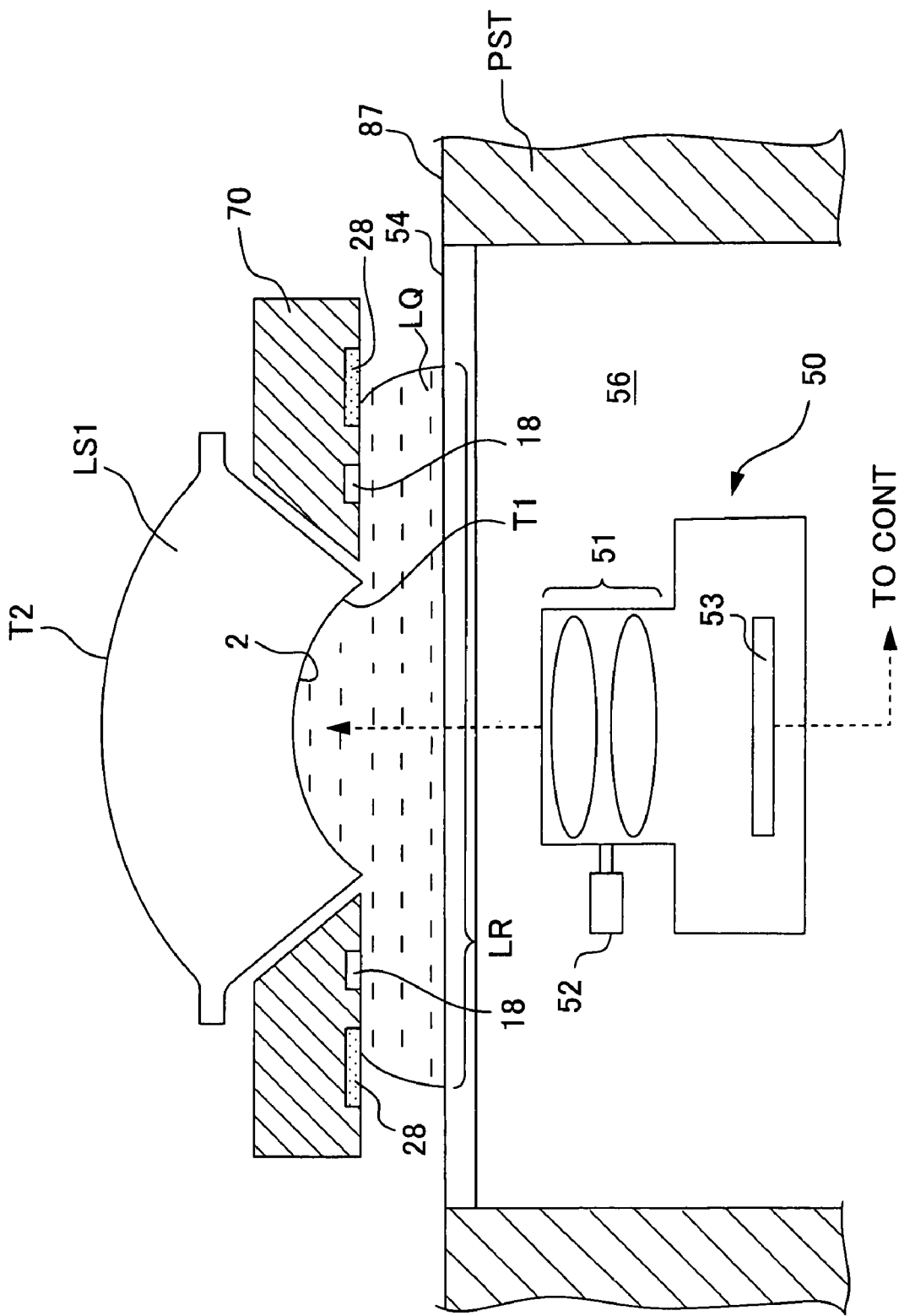
FIG. 6 shows a state in which a detection unit detects any foreign matter.

FIG. 6 shows a state in which the detection unit 50 detects the foreign matter (including the bubble). With reference to FIG. 6, the detection unit 50 is provided at the inside of the substrate stage PST. The detection unit 50 is arranged in the internal space 56 of the substrate stage PST. The detection unit 50 includes an optical system 51 which is arranged under a transparent member 54, and an image pickup element 53 which is composed of, for example, CCD. The image pickup element 53 is capable of obtaining an optical image (image) of, for example, the liquid LQ and the first optical element LS1 via the transparent member 54 and the optical system 51. The image pickup element 53 coverts the obtained image into an electric signal, and the signal (image information) is outputted to the control unit CONT. The detection unit 50 further includes an adjusting mechanism 52 which is capable of adjusting the focus position of the optical system 51. The detection unit 50 has a field capable of observing the entire liquid LQ arranged inside the concave surface portion 2. The entire detection unit 50 may be arranged in the substrate stage PST. Alternatively, for example, a part of the optical element among a plurality of optical elements for constructing the optical system 51 and the image pickup element 53, and the like may be arranged outside the substrate stage PST. Another arrangement may be also adopted, in which the adjusting mechanism 52 is omitted.

The control unit CONT uses the detection unit 50 to detect whether or not any bubble (foreign matter) is present in the liquid LQ of the liquid immersion area LR formed on the transparent member 54 (S3). The detection unit 50 observes, through the transparent member 54, the liquid LQ of the liquid immersion area LR on the upper surface of the transparent member 54. When the detection unit 50 observes the state of the liquid immersion area LR, the substrate stage PST substantially stands still. The image pickup element 53 of the detection unit 50 obtains the image of the liquid LQ for forming the liquid immersion area LR on the transparent member 54, via the transparent member 54 and the optical system 51. When the bubble (foreign matter) in the space inside of the concave surface portion 2, is detected by the detection unit 50, the control unit CONT uses the adjusting mechanism 52 to adjust the focus position of the optical system 51 to the position in the vicinity of the concave surface portion 2. Therefore, the image pickup element 53 can satisfactorily obtain the image of the liquid LQ in the concave surface portion 2 disposed over or above the transparent member 54. The detection unit 50 has the field which is larger than the concave surface portion 2. Therefore, it is possible to collectively obtain the full field image of the liquid LQ in the space inside of the concave surface portion 2.

The image information obtained by the image pickup element 53 is outputted to the control unit CONT. The control unit CONT performs the calculation processing (image processing) for the signal (image information) outputted from the image pickup element 53 to judge whether or not the bubble (foreign matter) is present in the liquid LQ on the basis of the result of the processing (S4).

If it is judged or determined that the bubble (foreign matter) is absent in the liquid LQ on the basis of the detection result of the detection unit 50, the control unit CONT performs the measurement process by various measuring units (not shown) provided on the substrate stage PST (S5). That is, the control unit CONT moves the substrate stage PST in the XY directions to move the liquid immersion area LR onto the measuring unit from the position on the transparent member 54. The measuring unit as described above is provided to perform the measurement process in relation to the exposure process. The measuring unit includes a substrate alignment system based on the FIA (field image alignment) system as disclosed, for example, in Japanese Patent Application Laid-open No. 4-65603 and a reference member having any mark to be measured by a mask alignment system based on the VRA (visual reticle alignment) as disclosed, for example, in Japanese Patent Application Laid-open No. 7-176468. The measuring unit further includes, for example, unevenness sensors for measuring the uneven illuminance as disclosed in Japanese Patent Application Laid-open No. 57-117238 and for measuring the fluctuation amount of the transmittance of the exposure light beam EL of the projection optical system PL as disclosed in Japanese Patent Application Laid-open No. 2001-267239, a spatial image-measuring sensor as disclosed in Japanese Patent Application Laid-open No. 2002-14005, and a radiation amount sensor (illuminance sensor) as disclosed in Japanese Patent Application Laid-open No. 11-16816. The measurement process is performed in a state in which the liquid immersion area LR of the liquid LQ is arranged on a predetermined measuring unit of the respective measuring units as described above. The baseline amount is derived and the calibration process for the projection optical system PL is performed by the control unit CONT on the basis of the measurement result obtained thereby. The reference member and the sensor, which are to be used for the measurement process as described above, will be briefly explained in a third embodiment described later on.

After the completion of, for example, the calibration process for the projection optical system PL, the control unit CONT moves the substrate stage PST in the XY directions so that the liquid immersion area LR, which is formed on the upper surface 87 of the substrate stage PST, is moved onto the substrate P. The control unit CONT radiates the exposure light beam EL onto the substrate P via the projection optical system PL and the liquid LQ from which the bubble (foreign matter) is removed to expose the substrate P (S6).

On the other hand, if it is judged that the bubble (foreign matter) is present in the liquid LQ (YES in S4) on the basis of the detection result of the detection unit 50, then the control unit CONT moves the substrate stage PST in the XY directions, and the liquid immersion area LR is moved again from the position on the transparent member 54 to the position over or above the recovery port 43 of the removing unit 40. The control unit CONT performs the operation for removing the bubble (foreign matter) by the removing unit 40 (S1). After performing the operation for removing the bubble (foreign matter) by the removing unit 40, the control unit CONT uses the detection unit 50 again to detect whether or not the bubble (foreign matter) is present in the liquid LQ (S2). The operation as described above is repeated until the bubble (foreign matter) is not detected in the liquid LQ by the detection unit 50. After the bubble (foreign matter) is not detected in the liquid LQ, the liquid immersion exposure is performed for the substrate P (S6).

In this procedure, after the liquid immersion area LR is formed by the liquid immersion mechanism 1, the control unit CONT uses the removing unit 40 to perform the operation for removing the bubble (foreign matter) contained in the liquid LQ, and then the control unit CONT uses the detection unit 50 to detect whether or not the bubble (foreign matter) contained in the liquid LQ is removed. However, it is also allowable to detect whether or not the bubble (foreign matter) is present in the liquid LQ by the detection unit 50 without performing the operation for removing the bubble (foreign matter) contained in the liquid LQ by the removing unit 40 after forming the liquid immersion area LR by the liquid immersion mechanism 1. In this procedure, when it is judged that the bubble (foreign matter) is absent in the liquid LQ on the basis of the detection result of the detection unit 50, the control unit CONT can perform the measurement process based on the use of the measuring unit and the exposure process for the substrate P without performing the removing operation by the removing unit 40. Therefore, it is possible to omit any useless operation which would be otherwise performed such that the removing operation is performed by the removing unit 40 although the bubble (foreign matter) is absent in the liquid LQ.

The control unit CONT can also perform the operation for removing the bubble (foreign matter) based on the use of the removing unit 40, for example, at every predetermined period of time or every time when a predetermined number of substrates are processed, irrelevantly to the detection result of the detection unit 50. The operation for removing the bubble (foreign matter) by the removing unit 40 and the detecting operation by the detection unit 50 may be performed after the exposure for the substrate P (before unloading the substrate P from the substrate holder PH).

As explained above, the first optical element LS1, which is included in the plurality of optical elements LS1 to LS5 for constructing the projection optical system PL and which is disposed closest to the image plane of the projection optical system PL, has the concave surface portion 2 which makes contact with the liquid LQ. Therefore, even when the liquid LQ has the refractive index higher than that of the first optical element LS1, the exposure light beam EL is successfully allowed to arrive at the substrate P (image plane) arranged on the image plane side of the projection optical system PL satisfactorily via the first optical element LS1 and the liquid LQ. Even when any bubble (foreign matter) enters the space inside of the concave surface portion 2, the bubble (foreign matter) is removed by the removing unit 40. Therefore, it is possible to allow the exposure light beam EL to satisfactorily arrive at the substrate P (image plane) arranged on the image plane side of the projection optical system PL.

Second Embodiment

Figure 7:
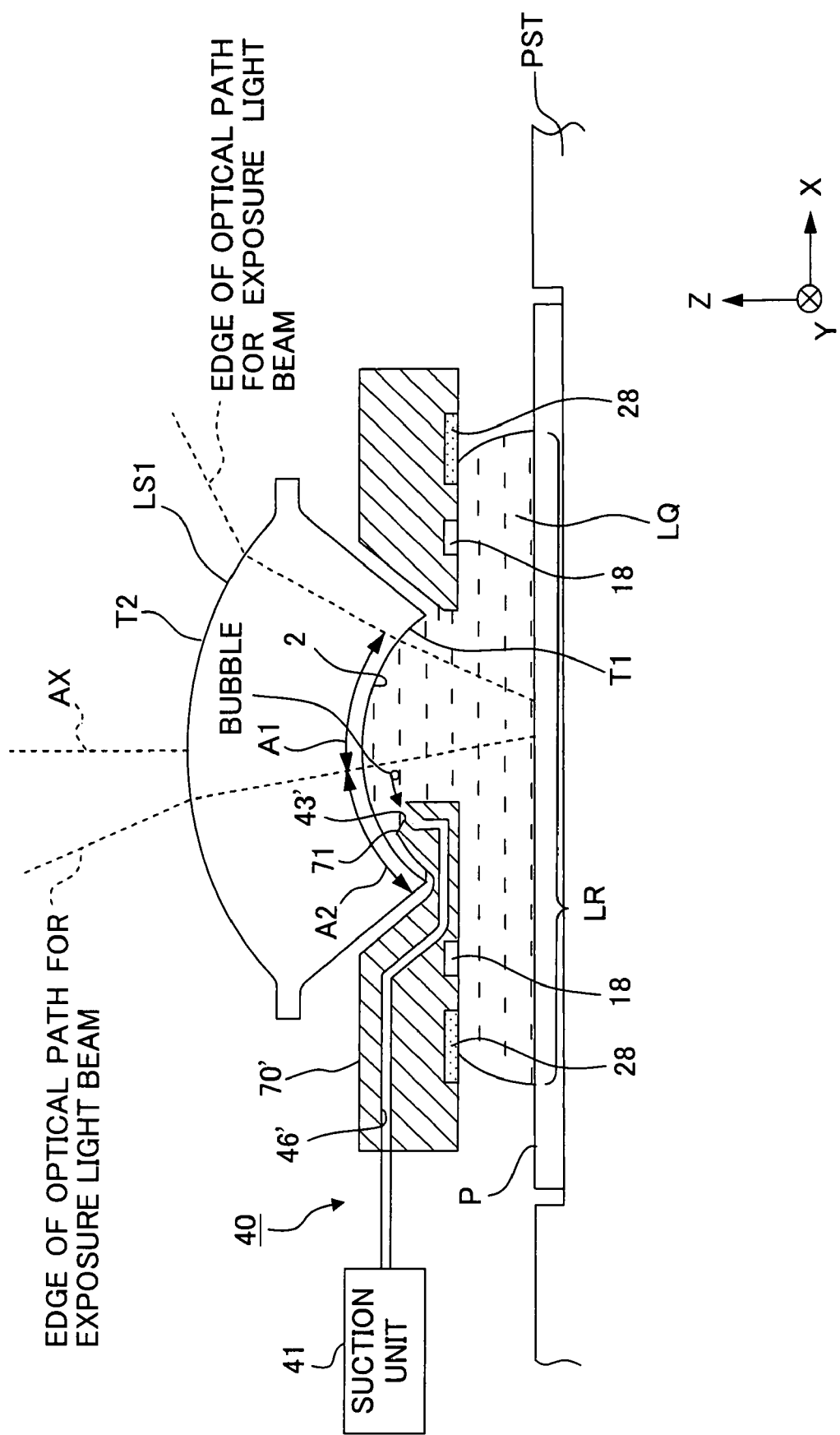
FIG. 7 shows a magnified view illustrating main components according to a second embodiment.

Next, a second embodiment will be explained with reference to FIG. 7. In the following description, any explanation will be simplified or omitted for constitutive parts which are the same as or equivalent to those of the embodiment described above. The point of the second embodiment different from the first embodiment, i.e., the feature of the second embodiment resides in the fact that a part of the removing unit 40 is provided for a nozzle member 70'. That is, in the second embodiment, a suction port 43' of the removing unit 40 is provided on the nozzle member 70'. The suction port 43' is connected to the suction unit 41 via a flow passage 46' formed in the nozzle member 70'. As shown in FIG. 7, a part of the nozzle member 70' is arranged under the concave surface portion 2 of the first optical element LS1. An opposing surface 71, which is opposed to the concave surface portion 2, is formed by the part of the nozzle member 70' arranged under the concave surface portion 2. The suction port 43' is formed on the opposing surface 71.

In the projection optical system PL of this embodiment, the optical path for the exposure light beam EL is deviated with respect to the optical axis AX (Z axis). That is, an area (hereinafter referred to as "effective area") A1 of the concave surface portion 2, through which the exposure light beam EL passes, is deviated with respect to the center of the concave surface portion 2 (highest position of the concave surface portion 2). An area (hereinafter referred to as "non-effective area") A2, through which the exposure light beam EL does not pass, is provided in the vicinity of the highest position of the concave surface portion 2. The opposing surface 71 is provided opposite to the non-effective area A2 of the concave surface portion 2. The suction port 43', which is provided on the opposing surface 71, is provided at the position opposed to the concave surface portion 2 outside the optical path for the exposure light beam EL.

The bubble (foreign matter) in the space inside of the concave surface portion 2, can be also removed by the aid of the suction port 43' without disturbing the passage of the exposure light beam EL by providing the suction port 43' at the part of the nozzle member 70' at the position outside the optical path for the exposure light beam EL opposite to the concave surface portion 2. In this embodiment, it is also possible to concurrently perform the exposure operation for the substrate P in a state in which the optical path space for the exposure light beam EL between the first optical element LS1 and the substrate P is filled with the liquid LQ and the sucking operation by the removing unit 40 by the aid of the suction port 43'.

Third Embodiment

Figure 8:
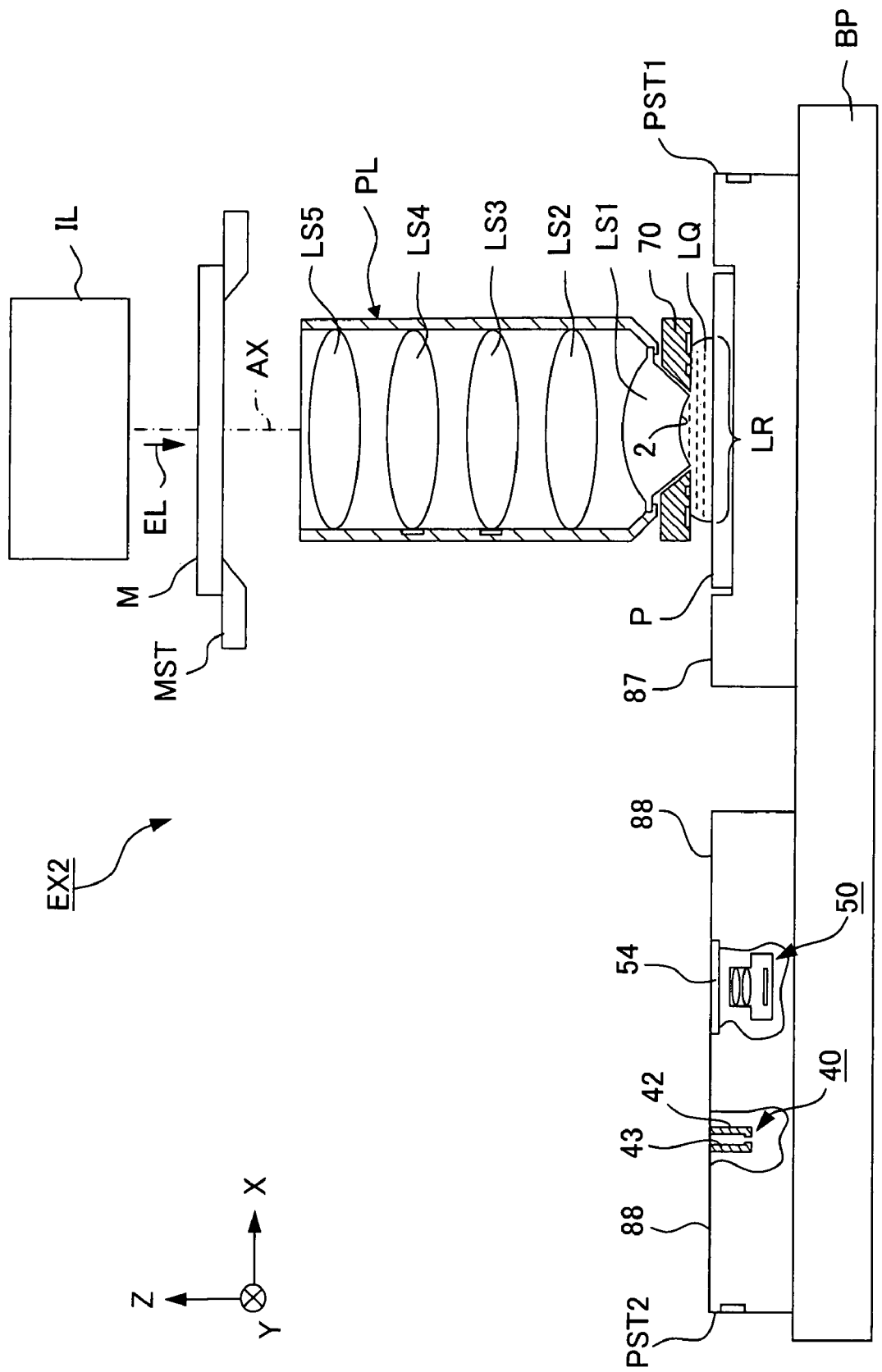
FIG. 8 shows a schematic arrangement illustrating an exposure apparatus according to a third embodiment.

Next, a third embodiment will be explained with reference to FIGS. 8 to 10. The point of the third embodiment different from the first embodiment, i.e., the feature of the third embodiment resides in the fact that an exposure apparatus EX2 has first and second stages PST1, PST2 which are movable on the image plane side of the projection optical system PL. The first stage PST1 is a substrate stage which is movable while holding the substrate P. The second stage PST2 is a measuring stage which carries measuring units for performing the measurement process in relation to the exposure process as disclosed, for example, in Japanese Patent Application Laid-open No. 11-135400. The removing unit 40 and the detection unit 50 are provided for the measuring stage PST2.

Figure 9:
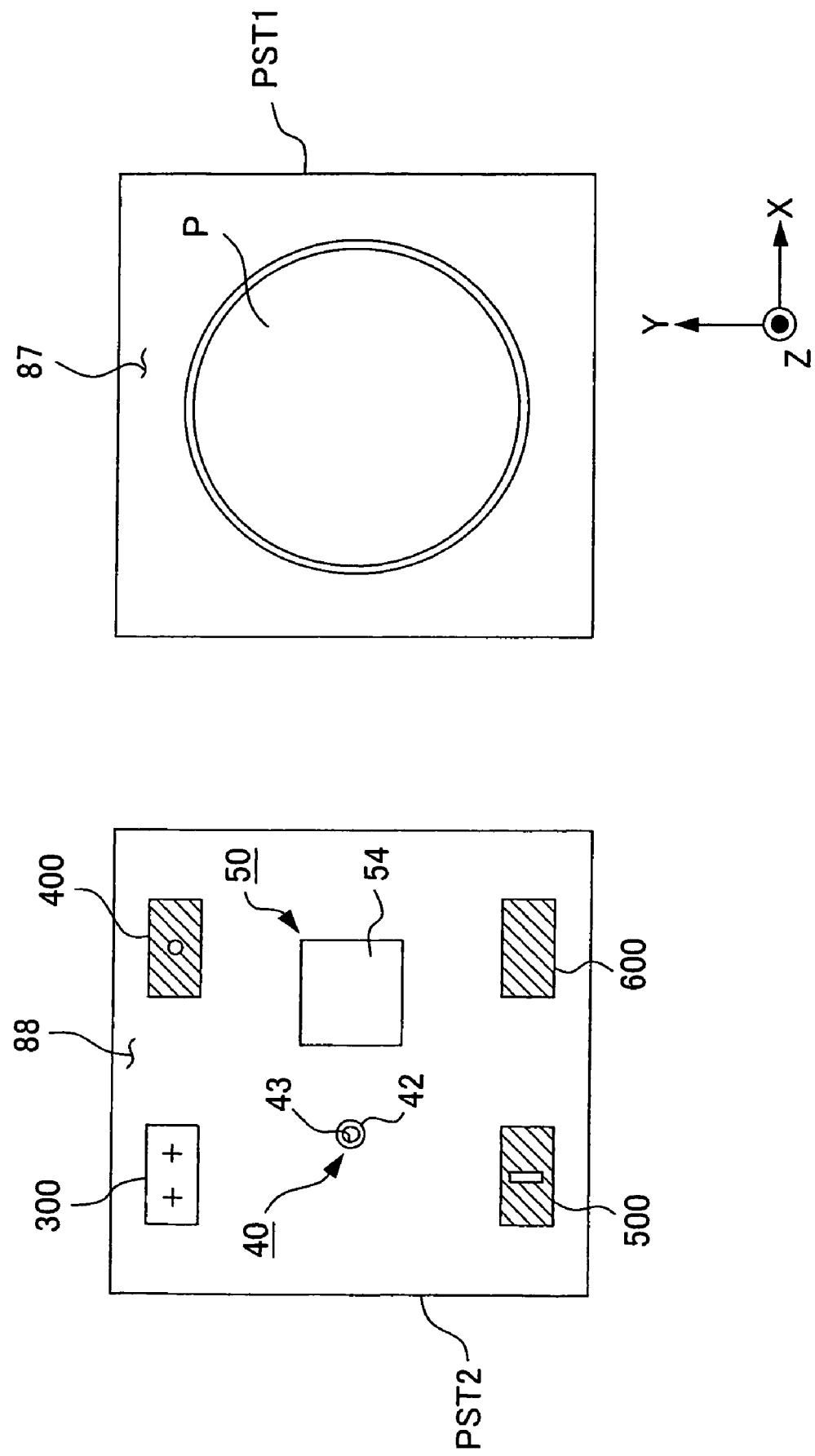
FIG. 9 shows a plan view illustrating stages shown in FIG. 8 as viewed from an upper position.

As shown in a plan view in FIG. 9, a reference member 300, which has marks as described above, is provided as the measuring unit on an upper surface 88 of the measuring stage PST2. An upper plate 400 for constructing an unevenness sensor as described above, an upper plate 500 for constructing a part of a spatial image-measuring sensor, and an upper plate 600 for constructing a part of a radiation amount sensor (illuminance sensor) are provided as measuring units on the upper surface 88. The upper surface of the reference member 300 and the upper surfaces of the upper plates 400, 500, 600 are substantially flush with the upper surface 88 of the measuring stage PST2 and the upper surface of the transparent member 54 of the detection unit 50. The measuring units provided for the measuring stage PST2 are not limited to those described herein. It is possible to carry various measuring units, if necessary.

When the substrate P is exposed by the exposure apparatus EX2, the control unit CONT firstly drives the liquid immersion mechanism 1 to form the liquid immersion area LR on the measuring stage PST2 in a state in which the first optical element LS1 of the projection optical system PL is opposed to the measuring stage PST2. Subsequently, the control unit CONT performs the operation for removing the bubble (foreign matter) contained in the space inside of the concave surface portion 2 of the first optical element LS1 by the removing unit 40 provided for the measuring stage PST2 in the same manner as in the first embodiment. The control unit CONT confirms whether or not the bubble (foreign matter) contained in the space inside of the concave surface portion 2 is removed, by the detection unit 50. If it is judged that the bubble (foreign matter) is present in the space inside of the concave surface portion 2 on the basis of the detection result obtained by the detection unit 50, the control unit CONT performs the operation for removing the bubble (foreign matter) by the removing unit 40 again. On the other hand, if it is judged that the bubble (foreign matter) is absent in the space inside of the concave surface portion 2 on the basis of the detection result obtained by the detection unit 50, the control unit CONT moves the liquid immersion area LR onto the substrate stage PST1 after performing the measurement process by the various measuring units as described above. In this procedure, the control unit CONT moves the substrate stage PST1 to the load position to load the substrate P to be subjected to the exposure process on the substrate stage PST1 during the period in which the operation for removing the bubble (foreign matter) based on the use of the removing unit 40 provided on the measuring stage PST2, the operation for detecting the bubble (foreign matter) based on the use of the detection unit 50, or the measurement process based on the use of the measuring unit is performed.

Figure 10:
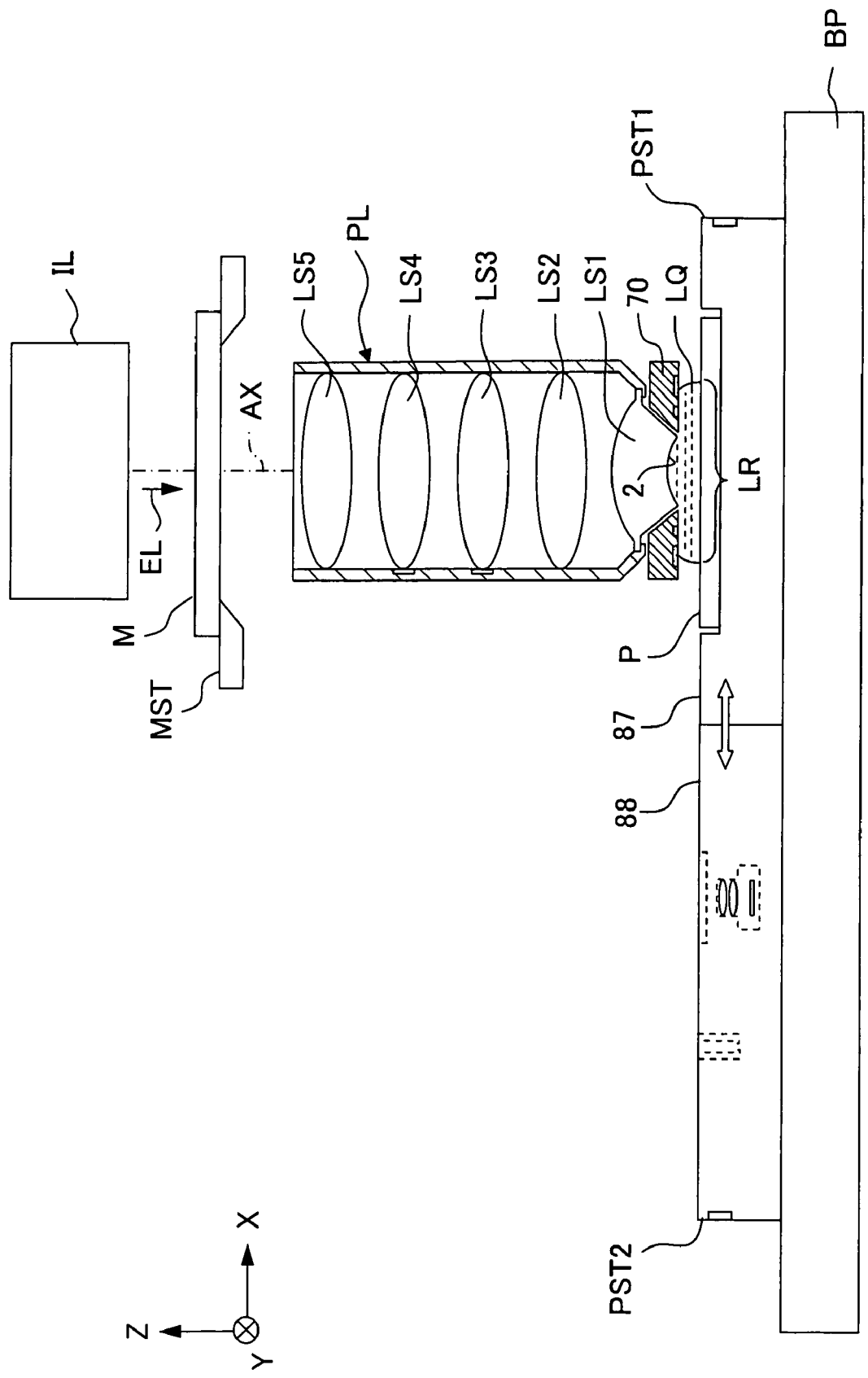
FIG. 10 shows the operation of the exposure apparatus according to the third embodiment.

As shown in FIG. 10, when the liquid immersion area LR on the measuring stage PST2 is moved onto the substrate stage PST1, then the control unit CONT moves the substrate stage PST1 and the measuring stage PST2 in the XY directions together in a state in which the substrate stage PST1 and the measuring stage PST2 are allowed to make approach closely to one another or make contact with each other, and the liquid immersion area LR is moved between the upper surface 87 of the substrate stage PST1 and the upper surface 88 of the measuring stage PST2. After the liquid immersion area LR is moved onto the substrate stage PST1, the control unit CONT exposes the substrate P on the substrate stage PST1 via the projection optical system PL and the liquid LQ. The control unit CONT performs the exposure process for the substrate P in consideration of the measurement result of the measurement process performed on the measuring stage PST2.

In the first to third embodiments described above, the control unit CONT may start the suction operation while the suction port 43 of the removing unit 40 is moved closer to the concave surface portion 2 by a predetermined distance before the operation for forming the liquid immersion area LR is started, i.e., in a state in which the side of the lower surface T1 of the concave surface portion 2 is not filled with the liquid LQ. The supply operation and the recovery operation for the liquid LQ by the liquid immersion mechanism 1 may be started in a state in which the suction operation is continued by the aid of the suction port 43. Accordingly, it is possible to further suppress the formation of the bubble (gas portion). When the suction operation is started by the aid of the suction port 43 before being filled with the liquid LQ, then the foreign matter, which floats in the gas space inside of the concave surface portion 2, can be removed, and then the side of the lower surface T1 of the concave surface portion 2 can be filled with the liquid LQ.

In the embodiments described above, the explanation has been made as exemplified by the case in which the suction port of the removing unit is provided, for example, on the nozzle member, the movable member, and the like (for example, the substrate stage, the measuring stage, and the like) which is movable on the image plane side of the projection optical system PL by way of example. However, for example, a suction member having a suction port may be supported by a support member called "column (body)" for supporting the projection optical system PL. Alternatively, a suction port to be connected to the suction unit may be formed at a portion of the concave surface portion 2 of the first optical element LS1 outside the optical path for the exposure light beam EL.

In the embodiments described above, the removing unit 40 removes the bubble (foreign matter) in the concave surface portion 2 formed on the lower surface T1 of the first optical element LS1 which is disposed closest to the image plane of the projection optical system PL and which is included in the plurality of optical elements LS1 to LS5 for constructing the projection optical system PL. However, a concave surface portion, which makes contact with the liquid, may be formed on any surface other than the lower surface of the first optical element LS1 depending on the arrangement of the projection optical system PL. Alternatively, a concave surface portion, which makes contact with the liquid, may be formed on any one of the optical elements LS2 to LS5 other than the first optical element LS1. For example, the liquid may be introduced into the space between the first optical element and the second optical element, and a lens, which has a concave curved surface as the lower surface (surface opposed to the first optical element), may be used as the second optical element. Even in the case of such an arrangement, it is possible to maintain the characteristic of the projection optical system PL by providing the removing unit to remove any foreign matter in the space inside of the concave surface portion.

In the embodiments described above, the liquid supply mechanism 10 is constructed such that the two types of the first and second liquids LQ1, LQ2 are mixed in the mixing unit 19, and the liquid LQ, which is prepared by the mixing unit 19, is supplied to the image plane side of the projection optical system PL. However, it is of course possible to provide such an arrangement that a plurality of arbitrary liquids of three or more types are mixed in the mixing unit 19, and the liquid LQ prepared by the mixing unit 19 is supplied.

Alternatively, the liquid supply mechanism 10 may supply one type of liquid (liquid having a refractive index higher than the refractive index of the first optical element LS1) without mixing the plurality of types of liquids. In this case, the liquid supply mechanism 10 is constructed to have no mixing unit 19.

The liquid LQ, which is supplied by the liquid supply mechanism 10, includes, for example, predetermined liquids having C—H bond and O—H bond such as isopropanol and glycerol, and predetermined liquid (organic solvents) such as hexane, heptane, decane, and the like. Alternatively, it is also allowable to use those obtained by mixing two or more arbitrary liquids of the predetermined liquids. Further alternatively, it is also allowable to use those obtained by adding (mixing) the predetermined liquid to pure water. Further alternatively, the liquid LQ, which is supplied by the liquid supply mechanism 10, may include those obtained by adding (mixing) a base or an acid for liberating anion or cation such as $H^+$, $Cs^+$, $K^+$, $Cl^-$, $SO_4^{2-}$, $PO_4^{2-}$, and the like to pure water. Further alternatively, it is also allowable to use those obtained by adding (mixing) fine particles of Al oxide or the like to pure water. The ArF excimer laser beam is transmissive through the liquid LQ as described above. As for the liquid LQ, it is preferable to use those in which the light absorption coefficient is small, the properties such as the refractive index scarcely depend on the temperature, and the liquid LQ is stable against the resist coated on the surface of the substrate P and the projection optical system PL.

Those having refractive indexes of about 1.6 to 1.8 may be used as the liquid LQ. Further, as for the first optical element LS1, any material having a refractive index (for example, not less than 1.6) higher than those of silica glass and calcium fluoride may be used to form the first optical element LS1.

In the embodiments described above, the liquid immersion area LR is formed with the liquid having the refractive index higher than the refractive index of the first optical element LS1. However, there is no limitation thereto. For example, a liquid having a refractive index lower than the refractive index of the first optical element LS1 may be used. For example, a lens made of silica glass may be used as the first optical element LS1, and pure water may be used as the liquid LQ. In the case of such an arrangement, the total reflection tends to occur when the angle of inclination of the light component of the light flux, especially the outermost beam of the light flux, with respect to the optical axis (or NA) is increased, the light flux being allowed to come from the first optical element LS1 into the interface between the first optical element LS1 and the liquid LQ, and the light component being inclined with respect to the optical axis AX. Therefore, the arrangement, in which the surface of the optical element included in the projection optical system to make contact with the liquid is the concave surface, especially the concave curved surface, is effective regardless of the refractive index of the liquid LQ with respect to the refractive index of the optical element, because it is possible to lower the angle of incidence into the interface between the liquid and the optical element.

In the first to third embodiments described above, the ArF excimer laser is used as the exposure light beam EL. However, as described above, it is possible to adopt various types of exposure light beams (exposure beams) including, for example, the $F_2$ laser. As for the liquid LQ to be supplied from the liquid supply mechanism 10, any optimum liquid can be appropriately used depending on, for example, the exposure light beam (exposure beam) EL, the numerical aperture of the projection optical system PL, and the refractive index of the first optical element LS1 with respect to the exposure light beam EL.

In the first to third embodiments described above, at least a part of the liquid LQ recovered by the liquid recovery mechanism 20 is returned to the liquid supply mechanism 10. However, all of the liquid, which is recovered by the liquid recovery mechanism 20, may be discarded, and the new and clean liquid LQ may be supplied from the liquid supply mechanism 10. The structure of the liquid immersion mechanism 1 including, for example, the nozzle member 70 is not limited to the above. It is also possible to use those described, for example, in European Patent Publication No. 1420298 and International Publication Nos. 2004/055803, 2004/057589, 2004/057590, and 2005/029559.

In the first to third embodiments described above, the detection unit 50 is provided. However, the detection unit 50 may be omitted, and it is also allowable to judge that the bubble (foreign matter) is absent in the space inside of the concave surface portion 2 on the basis of the completion of the removing operation performed by the removing unit 40.

In the third embodiment described above, the removing unit 40 may be arranged for the substrate stage PST1.

In the first to third embodiments described above, the explanation has been made about the case in which the refractive index of the first optical element LS1 with respect to the exposure light beam EL is smaller than the numerical aperture NA of the projection optical system PL. However, the optical element such as the first optical element LS1, which has the concave surface portion 2, can be also adopted when the refractive index of the optical element with respect to the exposure light beam is larger than the numerical aperture NA of the projection optical system PL. Also in this case, it is possible to adapt the removing unit as explained in the first to third embodiments.

When the numerical aperture NA of the projection optical system is large due to the use of the liquid immersion method as described above, it is desirable to use the polarized illumination, because the image formation performance is deteriorated due to the polarization effect in some cases with the random polarized light which has been hitherto used as the exposure light beam. In this case, it is appropriate that the linear polarized illumination, which is adjusted to the longitudinal direction of the line pattern of the line-and-space pattern of the mask (reticle), is effected so that the diffracted light of the S-polarized light component (TE-polarized light component), i.e., the component in the polarization direction along with the longitudinal direction of the line pattern is dominantly allowed to outgo from the pattern of the mask (reticle). When the space between the projection optical system PL and the resist applied to the surface of the substrate P is filled with the liquid, the diffracted light of the S-polarized light component (TE-polarized light component), which contributes to the improvement in the contrast, has the high transmittance on the resist surface, as compared with the case in which the space between the projection optical system PL and the resist applied to the surface of the substrate P is filled with the air (gas). Therefore, it is possible to obtain the high image formation performance even when the numerical aperture NA of the projection optical system exceeds 1.0. Further, it is more effective to appropriately combine, for example, the phase shift mask and the oblique incidence illumination method or the like (especially the dipole illumination method) adjusted to the longitudinal direction of the line pattern as disclosed in Japanese Patent Application Laid-open No. 6-188169. In particular, the combination of the linear polarized illumination method and the dipole illumination method is effective when the periodic direction of the line-and-space pattern is restricted to one predetermined direction and when the hole pattern is clustered in one predetermined direction. For example, when a phase shift mask of the half tone type having a transmittance of 6% (pattern having a half pitch of about 45 nm) is illuminated by the linear polarized illumination method and the dipole illumination method in combination, the depth of focus (DOF) can be increased by about 150 nm as compared with the use of the random polarized light provided that the illumination a, which is prescribed by the circumscribed circle of the two light fluxes for forming the dipole on the pupil plane of the illumination system, is 0.95, the radius of each of the light fluxes at the pupil plane is 0.125 σ, and the numerical aperture of the projection optical system PL is NA=1.2.

It is also effective to adopt a combination of the linear polarized illumination and the small σ illumination method (illumination method wherein the σ value, which indicates the ratio between the numerical aperture NAi of the illumination system and the numerical aperture NAp of the projection optical system, is not more than 0.4).

For example, when the ArF excimer laser is used as the exposure light beam, and the substrate P is exposed with a fine line-and-space pattern (for example, line-and-space of about 25 to 50 nm) by the projection optical system PL having a reduction magnification of about ¼, then the mask M acts as a polarizing plate due to the Wave guide effect depending on the structure of the mask M (for example, the pattern fineness and the thickness of chromium), and the diffracted light of the S-polarized light component (TE-polarized light component) outgoes from the mask M in an amount larger than that of the diffracted light of the P-polarized light component (TM-polarized light component) which lowers the contrast. In this case, it is desirable to use the linear polarized illumination as described above. However, even when the mask M is illuminated with the random polarized light, it is possible to obtain the high resolution performance even when the numerical aperture NA of the projection optical system PL is large.

When the substrate P is exposed with an extremely fine line-and-space pattern on the mask M, there is such a possibility that the P-polarized light component (TM-polarized light component) is larger than the S-polarized light component (TE-polarized light component) due to the Wire Grid effect. However, for example, when the ArF excimer laser is used as the exposure light beam, and the substrate P is exposed with a line-and-space pattern larger than 25 nm by the projection optical system PL having a reduction magnification of about ¼, then the diffracted light of the S-polarized light component (TE-polarized light component) outgoes from the mask M in an amount larger than that of the diffracted light of the P-polarized light component (TM-polarized light component). Therefore, it is possible to obtain the high resolution performance even when the numerical aperture NA of the projection optical system PL is large.

Further, it is also effective to use the combination of the oblique incidence illumination method and the polarized illumination method in which the linear polarization is effected in the tangential (circumferential) direction of the circle having the center of the optical axis as disclosed in Japanese Patent Application Laid-open No. 6-53120, without being limited to only the linear polarized illumination (S-polarized illumination) adjusted to the longitudinal direction of the line pattern of the mask (reticle). In particular, when the pattern of the mask (reticle) includes not only the line pattern extending in one predetermined direction, but the pattern also includes the line patterns extending in a plurality of different directions in a mixed manner (line-and-space patterns having different periodic directions are present in a mixed manner), then it is possible to obtain the high image formation performance even when the numerical aperture NA of the projection optical system is large, by using, in combination, the zonal illumination method and the polarized illumination method in which the light is linearly polarized in the tangential direction of the circle having the center of the optical axis, as disclosed in Japanese Patent Application Laid-open No. 6-53120 as well. For example, when a phase shift mask of the half tone type having a transmittance of 6% (pattern having a half pitch of about 63 nm) is illuminated by using, in combination, the zonal illumination method (zonal ratio: 3/4) and the polarized illumination method in which the light is linearly polarized in the tangential direction of the circle having the center of the optical axis, the depth of focus (DOF) can be increased by about 250 nm as compared with the use of the random polarized light provided that the illumination a is 0.95 and the numerical aperture of the projection optical system PL is NA=1.00. In the case of a pattern having a half pitch of about 55 nm and a numerical aperture of the projection optical system NA=1.2, the depth of focus can be increased by about 100 nm.

In addition to the various types of the illumination methods as described above, it is also effective to adapt, for example, the progressive multi-focal exposure method disclosed in Japanese Patent Application Laid-open Nos. 4-277612 and 2001-345245, and the multiwavelength exposure method to obtain an effect equivalent to that of the multi-focal exposure method by a multiwavelength (for example, two wavelengths) exposure light beam.

It is also allowable that the first optical element LS1 is tightly fixed so that the first optical element LS1 is not moved, without allowing the first optical element LS1 to be exchangeable. In this case, an exchangeable optical member may be arranged between the substrate P (image plane) and the first optical element LS1 having the curved lower surface T1.

The substrate P, which is usable in the respective embodiments described above, is not limited to the semiconductor wafer for producing the semiconductor device. Those applicable include, for example, the glass substrate for the display device, the ceramic wafer for the thin film magnetic head, the master plate (synthetic silica glass, silicon wafer) for the mask or the reticle to be used for the exposure apparatus, and the like. In the embodiment described above, the light-transmissive type mask (reticle) is used, in which the predetermined light-shielding pattern (or phase pattern or dimming or light-reducing pattern) is formed on the light-transmissive substrate. However, in place of such a reticle, as disclosed, for example, in U.S. Pat. No. 6,778,257, it is also allowable to use an electronic mask on which a transmissive pattern, a reflective pattern, or a light-emitting pattern is formed on the basis of the electronic data of the pattern to be subjected to the exposure.

As for the exposure apparatus EX, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P.

As for the exposure apparatus EX, the present invention is also applicable to the exposure apparatus based on the system in which the full field exposure is performed on the substrate P by a projection optical system (for example, the dioptric type projection optical system having a reduction magnification of ⅛ and including no catoptric element) with a reduction image of a first pattern in a state in which the first pattern and the substrate P are allowed to substantially stand still. In this case, the present invention is also applicable to the full field exposure apparatus based on the stitch system in which the full field exposure is further performed thereafter on the substrate P by partially overlaying a reduction image of a second pattern with respect to the first pattern by the projection optical system in a state in which the second pattern and the substrate P are allowed to substantially stand still. As for the exposure apparatus based on the stitch system, the present invention is also applicable to the exposure apparatus based on the step-and-stitch system in which at least two patterns are partially overlaid and transferred on the substrate P, and the substrate P is successively moved.

The present invention is also applicable to the twin-stage type exposure apparatus. The structure and the exposure operation of the twin-stage type exposure apparatus are disclosed, for example, in Japanese Patent Application Laid-open Nos. 10-163099 and 10-214783 (corresponding to U.S. Pat. Nos. 6,341,007, 6,400,441, 6,549,269, and 6,590,634), Japanese Patent Application Laid-open No. 2000-505958 (PCT) (corresponding to U.S. Pat. No. 5,969,441), and U.S. Pat. No. 6,208,407. The disclosures thereof are incorporated herein by reference within a range of permission of the domestic laws and ordinances of the state designated or selected in this international application.

In the first to third embodiments described above, the exposure apparatus, in which the space between the projection optical system PL and the substrate P is locally filled with the liquid, is adopted. However, the present invention is also applicable to such an exposure apparatus that the exposure is performed for a substrate in a state in which the entire surface of the substrate for exposure is immersed in the liquid, as disclosed, for example, in Japanese Patent Application Laid-open Nos. 6-124873 and 10-303114 and U.S. Pat. No. 5,825,043. The structure and the exposure operation of such a liquid immersion exposure apparatus are described in detail in U.S. Pat. No. 5,825,043. The contents of the description in this United States patent document are incorporated herein by reference within a range of permission of the domestic laws and ordinances of the state designated or selected in this international application.

As for the type of the exposure apparatus EX, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118. The contents of the descriptions in the literatures are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by means of the electromagnetic force. In this case, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by a frame member so that the reaction force is not transmitted to the projection optical system PL, as described in Japanese Patent Application Laid-open No. 8-166475 (U.S. Pat. No. 5,528,118). The contents of the descriptions in U.S. Pat. No. 5,528,118 are incorporated herein by reference within a range of permission of the domestic laws and ordinances of the state designated or selected in this international application.

The reaction force, which is generated in accordance with the movement of the mask stage MST, may be mechanically released to the floor (ground) by a frame member so that the reaction force is not transmitted to the projection optical system PL, as described in Japanese Patent Application Laid-open No. 8-330224 (U.S. Pat. No. 5,874,820). The disclosure of U.S. Pat. No. 5,874,820 is incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, the piping connection of the air pressure circuits, and the like in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature, the cleanness and the like are managed.

Figure 11:
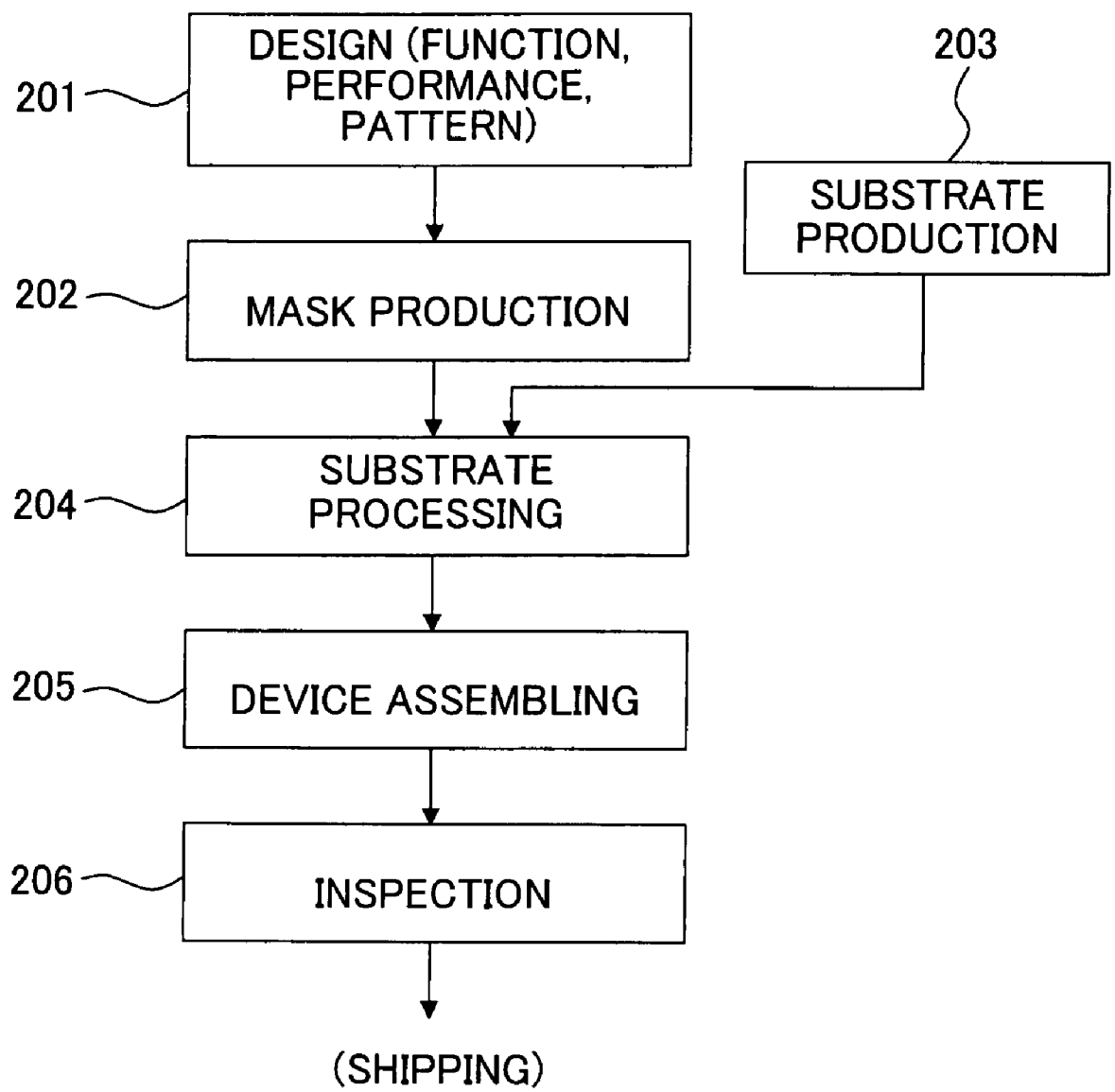
FIG. 11 shows a flow chart illustrating exemplary steps of producing a microdevice.

As shown in FIG. 11, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, a substrate processing step 204 of exposing the substrate with a pattern of the mask by the exposure apparatus EX of the embodiment described above and developing the exposed substrate, a step of assembling the device (including a dicing step, a bonding step, and a packaging step) 205, an inspection step 206, and the like. The substrate processing step 204 includes the process such as a step of removing the foreign matter and a step of inspecting the foreign matter as explained with reference to FIGS. 5 to 7 and 12.

INDUSTRIAL APPLICABILITY

According to the present invention, it is possible to realize the liquid immersion exposure in which the substrate is exposed through the liquid. Therefore, it is possible to produce the device having the device pattern in which the resolution and the density are further enhanced.

The invention claimed is:

1. An exposure apparatus which exposes a substrate by radiating an exposure light beam onto the substrate through a liquid, the exposure apparatus comprising:
    a projection optical system which includes a plurality of optical elements, at least one of the plurality of optical elements having a concave surface portion making contact with the liquid; and
    a removing device which removes a foreign matter in a space inside of the concave surface portion, wherein
    the removing device has a suction port which sucks the foreign matter, and
    the removing device has a driving system which moves the suction port relative to the concave surface portion.

2. The exposure apparatus according to claim 1, wherein the concave surface portion is formed on a lower surface of a first optical element, included in the plurality of optical elements, and which is disposed closest to an image plane of the projection optical system, and an optical path space formed between the first optical element and an object arranged on a side of an image plane of the projection optical system and filled with the liquid.

3. The exposure apparatus according to claim 2, wherein the removing device removes the foreign matter which is present in the liquid arranged in the space inside of the concave surface portion and which has a specific gravity smaller than that of the liquid.

4. The exposure apparatus according to claim 1, wherein the foreign matter includes a bubble.

5. The exposure apparatus according to claim 1, wherein the suction port is arranged at a highest position in the space inside of the concave surface portion or at a position near the highest position.

6. The exposure apparatus according to claim 1, wherein the suction port is provided at a position opposed to the concave surface portion.

7. The exposure apparatus according to claim 1, wherein the suction port is provided outside an optical path for the exposure light beam.

8. The exposure apparatus according to claim 1, wherein the removing device performs suction in a state in which the suction port is moved closer to the concave surface portion by a predetermined distance.

9. The exposure apparatus according to claim 1, wherein the removing device is provided on a movable member which is movable on a side of an image plane of the projection optical system.

10. The exposure apparatus according to claim 9, wherein the movable member includes at least one of a first movable member movable while holding the substrate, and a second movable member provided with a measuring device which performs measuring operation in relation to an exposure process.

11. The exposure apparatus according to claim 1, further comprising:
    a nozzle member which has at least one of a supply port which supplies the liquid and a recovery port which recovers the liquid, wherein:
    the removing device is provided for the nozzle member.

12. The exposure apparatus according to claim 1, further comprising:
    a detection device which detects whether the foreign matter is present; and a control device which controls operation of the removing device on the basis of a detection result of the detection device.

13. The exposure apparatus according to claim 1, further comprising a liquid supply system which supplies the liquid, wherein the liquid supply system has a mixing device which mixes a plurality of types of liquids, and the liquid supply system supplies a mixed liquid mixed in the mixing device.

14. The exposure apparatus according to claim 2, wherein a refractive index of the liquid is higher than a refractive index of the first optical element.

15. The exposure apparatus according to claim 2, wherein a numerical aperture of the projection optical system is higher than a refractive index of the first optical element.

16. The exposure apparatus according to claim 1, wherein the concave surface portion is a curved surface.

17. The exposure apparatus according to claim 1, wherein the liquid includes at least one of glycerol and isopropanol.

18. The exposure apparatus according to claim 14, wherein a numerical aperture of the projection optical system is larger than the refractive index of the first optical element.

19. The exposure apparatus according to claim 14, wherein the first optical element is formed of silica glass or calcium fluoride.

20. The exposure apparatus according to claim 14, wherein the refractive index of the liquid with respect to the exposure light beam is not less than 1.5.

21. A method for producing a device, the method comprising:
transferring a pattern onto a substrate with the exposure apparatus according to claim 1; and
processing the substrate to form the device.

22. An exposure method which exposes a substrate by radiating an exposure light beam onto the substrate via a liquid and an optical element having a concave surface portion which makes contact with the liquid, the exposure method comprising:
removing a foreign matter from the liquid in a space inside of the concave surface portion of the optical element with a removing device having a suction port which sucks the foreign matter,
exposing the substrate by radiating the exposure light beam onto the substrate via the optical element and the liquid, and
moving the suction port relative to the concave surface portion with a driving system.

23. The exposure method according to claim 22, wherein the substrate is exposed after and/or while removing the foreign matter.

24. The exposure method according to claim 22, further comprising:
detecting the foreign matter present in the liquid in the space inside of the concave surface portion of the optical element.

25. The exposure method according to claim 24, wherein the foreign matter is removed in accordance with a result of detection of the foreign matter.

26. The exposure method according to claim 22, wherein a refractive index of the liquid is higher than a refractive index of the optical element with respect to the exposure light beam.

27. The exposure method according to claim 26, wherein the exposure light beam is radiated onto the substrate through the liquid by a projection optical system which includes the optical element and which has a numerical aperture higher than the refractive index of the optical element.

28. The exposure method according to claim 26, wherein the refractive index of the liquid with respect to the exposure light beam is not less than 1.5.

29. A method for producing a device, comprising:
exposing a substrate by the exposure method as defined in claim 22;
developing the exposed substrate; and
processing the developed substrate.

* * * * *